(12) United States Patent
Zapalac et al.

(10) Patent No.: US 8,318,240 B2
(45) Date of Patent: *Nov. 27, 2012

(54) METHOD AND APPARATUS TO REMOVE A SEGMENT OF A THIN FILM SOLAR CELL STRUCTURE FOR EFFICIENCY IMPROVEMENT

(75) Inventors: Geordie Zapalac, Santa Cruz, CA (US); David Soltz, San Jose, CA (US); Bulent M. Basol, Manhattan Beach, CA (US)

(73) Assignee: SoloPower, Inc., San Jose, CA (US)

( * ) Notice: Subject to any disclaimer, the term of this patent is extended or adjusted under 35 U.S.C. 154(b) by 254 days.

This patent is subject to a terminal disclaimer.

(21) Appl. No.: 12/703,120

(22) Filed: Feb. 9, 2010

(65) Prior Publication Data

US 2010/0178716 A1 Jul. 15, 2010

Related U.S. Application Data

(63) Continuation-in-part of application No. 12/272,499, filed on Nov. 17, 2008.

(60) Provisional application No. 61/151,173, filed on Feb. 9, 2009.

(51) Int. Cl.
*B05D 5/12* (2006.01)
*B05D 3/12* (2006.01)
*C23C 16/52* (2006.01)
*B05C 13/00* (2006.01)
*B23P 6/00* (2006.01)

(52) U.S. Cl. ............... 427/74; 427/8; 427/76; 427/142; 427/277; 427/356; 29/402.09

(58) Field of Classification Search .......... 427/8, 74–76, 427/140, 142, 355–357, 277; 29/402.09
See application file for complete search history.

(56) References Cited

U.S. PATENT DOCUMENTS

| | | | |
|---|---|---|---|
| 4,166,918 A | 9/1979 | Nostrand et al. | |
| 4,451,970 A | 6/1984 | Izu et al. | |
| 4,640,002 A | 2/1987 | Phillips et al. | |
| 4,729,970 A | 3/1988 | Nath et al. | |
| 4,862,000 A | 8/1989 | Kubota et al. | |
| 5,677,204 A | 10/1997 | Imai et al. | |
| 5,714,195 A * | 2/1998 | Shiba et al. | 427/140 |
| 6,132,585 A * | 10/2000 | Midorikawa et al. | 205/123 |

(Continued)

FOREIGN PATENT DOCUMENTS

EP 1163552 3/2007

OTHER PUBLICATIONS

International Search Report issued Jan. 20, 2010 in PCT/US09/64604.

*Primary Examiner* — James Lin
(74) *Attorney, Agent, or Firm* — Pillsbury Winthrop Shaw Pittman LLP

(57) ABSTRACT

The present inventions relate to methods and apparatus for detecting and mechanically removing defects and a surrounding portion of the photovoltaic layer and the substrate in a thin film solar cell such as a Group IBIIIAVIA compound thin film solar cell to improve its efficiency.

33 Claims, 11 Drawing Sheets

U.S. PATENT DOCUMENTS

| | | |
|---|---|---|
| 6,225,640 B1 | 5/2001 | Glenn et al. |
| 6,750,662 B1 | 6/2004 | Van Der Heide |
| 6,979,391 B1 | 12/2005 | Hubel |
| 7,979,969 B2 * | 7/2011 | Basol .................. 29/402.06 |
| 2001/0013361 A1 * | 8/2001 | Fujisawa et al. ............ 136/256 |
| 2003/0145624 A1 * | 8/2003 | Luettgens et al. ............ 65/17.1 |
| 2006/0207644 A1 * | 9/2006 | Robinson et al. ............ 136/243 |
| 2007/0227586 A1 | 10/2007 | Zapalac |
| 2008/0093221 A1 | 4/2008 | Basol |
| 2008/0171422 A1 * | 7/2008 | Tokie et al. .................. 438/479 |

* cited by examiner

METHOD AND APPARATUS TO REMOVE A SEGMENT OF A THIN FILM SOLAR CELL STRUCTURE FOR EFFICIENCY IMPROVEMENT

CLAIM OF PRIORITY-CROSS REFERENCE TO RELATED APPLICATIONS

This application is related to and claims priority from U.S. Provisional Patent Application Ser. No. 61/151,173 filed Feb. 9, 2009 entitled "METHOD AND APPARATUS TO REMOVE A SEGMENT OF A THIN FILM SOLAR CELL STRUCTURE FOR EFFICIENCY IMPROVEMENT and this application is a Continuation-in-Part of U.S. patent application Ser. No. 12/272,499, filed on Nov. 17, 2008, entitled "METHOD AND APPARATUS FOR DETECTING AND PASSIVATING DEFECTS IN THIN FILM SOLAR CELLS," which application is expressly incorporated herein by reference.

BACKGROUND

1. Field of the Inventions

The present inventions relate to method and apparatus for detecting the locations of and efficiently removing defects in a thin film solar cell such as a Group IBIIIAVIA compound thin film solar cell fabricated on a flexible foil substrate to improve its efficiency.

2. Description of the Related Art

Solar cells are photovoltaic devices that convert sunlight directly into electrical power. The most common solar cell material is crystalline silicon, which is in the form of single or polycrystalline wafers. However, the cost of electricity generated using silicon-based solar cells is higher than the cost of electricity generated by the more traditional methods. Therefore, since the early 1970's there has been an effort to reduce cost of solar cells for terrestrial use. One way of reducing the cost of solar cells is to develop low-cost thin film growth techniques that can deposit solar-cell-quality absorber materials on large area substrates and to fabricate these devices using high-throughput, low-cost methods.

Group IBIIIAVIA compound semiconductors comprising some of the Group IB (Cu, Ag, Au), Group IIIA (B, Al, Ga, In, Tl) and Group VIA (O, S, Se, Te, Po) materials or elements of the periodic table are excellent absorber materials for thin film solar cell structures. Especially, compounds of Cu, In, Ga, Se and S which are generally referred to as CIGS-type, or CIGS(S), or $Cu(In,Ga)(S,Se)_2$ or $CuIn_{1-x}Ga_x(S_ySe_{1-y})_k$, where $0 \leq x \leq 1$, $0 \leq y \leq 1$ and k is approximately 2, have already been employed in solar cell structures that yielded high conversion efficiencies. Specifically, $Cu(In,Ga)Se_2$ or CIGS absorbers have been used to demonstrate 19.9% efficient solar cells. In summary, compounds containing: i) Cu from Group IB, ii) at least one of In, Ga, and Al from Group IIIA, and iii) at least one of S, Se, and Te from Group VIA, are of great interest for solar cell applications.

The structure of a conventional Group IBIIIAVIA compound photovoltaic cell such as a $Cu(In,Ga,Al)(S,Se,Te)_2$ thin film solar cell is shown in FIG. 1. The device 10 is fabricated over a substrate 11, such as a sheet of glass, a sheet of metal, an insulating foil or web, or a conductive foil or web. The absorber film 12, which comprises a material in the family of $Cu(In,Ga,Al)(S,Se,Te)_2$, is grown on a conductive layer 13 or contact layer, which is previously deposited on the substrate 11 and which acts as the electrical contact to the device. The substrate 11 and the conductive layer 13 form a base 13A on which the absorber film 12 is formed. Various conductive layers comprising Mo, Ta, W, Ti, and stainless steel etc. have been used in the solar cell structure of FIG. 1. If the substrate itself is a properly selected conductive material, it is possible not to use the conductive layer 13, since the substrate 11 may then be used as the ohmic contact to the device. After the absorber film 12 is grown, a transparent layer 14 such as a CdS, ZnO or CdS/ZnO etc. stack is formed on the absorber film. Radiation 15 enters the device through the transparent layer 14. The transparent layer 14 is sometimes referred to as the window layer. Metallic grids (not shown) may also be deposited over the transparent layer 14 to reduce the effective series resistance of the device. The preferred electrical type of the absorber film 12 is p-type, and the preferred electrical type of the transparent layer 14 is n-type. However, an n-type absorber and a p-type window layer can also be utilized. The preferred device structure of FIG. 1 is called a "substrate-type" structure. A "superstrate-type" structure can also be constructed by depositing a transparent conductive layer on a transparent superstrate such as glass or transparent polymeric foil, and then depositing the $Cu(In,Ga,Al)(S,Se,Te)_2$ absorber film, and finally forming an ohmic contact to the device by a conductive layer. In this superstrate structure light enters the device from the transparent superstrate side. A variety of materials, deposited by a variety of methods, can be used to provide the various layers of the device shown in FIG. 1.

The conversion efficiency of a thin film solar cell depends on many fundamental factors, such as the bandgap value and electronic and optical quality of the absorber layer, the quality of the window layer, the quality of the rectifying junction, etc. A common practical problem associated with manufacturing thin film devices, however, is the inadvertent introduction of defects into the device structure. Since the total thickness of the electrically active layers of thin film solar cells is in the range of 0.5-5 micrometers, these devices are highly sensitive to defectivity. Even the micron size defects may influence their illuminated I-V characteristics. There may be different types of defects in thin film solar cell structures. Some of these defects may be only morphological in nature and are not electrically active. Other defects may be electrically active and may negatively impact the performance of the device. Shunting defects, for example, may introduce a shunting path through which the electrical current of the device may leak. Such shunting defects lower the fill factor, the voltage and the conversion efficiency of the solar cells, and therefore they need to be minimized, eliminated or passivated. Detection and passivation of harmful defects improves the yield of thin film solar cell processing and therefore may be critical for low cost, high efficiency thin film solar cell manufacturing.

Prior work in eliminating shunting defects in solar cells includes work by Nostrand et al. (U.S. Pat. No. 4,166,918) who used an approach to bias the cell and heat up the shunts that carry a high current. A cermet material was incorporated into the cell stack which preferentially formed insulators at the shunt positions during the bias due to local heating. Izu et al. (U.S. Pat. No. 4,451,970) scanned the surface of the solar cell with a contacting liquid bead which electrochemically etched or anodized the shorting regions. The etched regions could then be filled with a dielectric. This technique may be applicable for the amorphous Si type solar cells. However, etching or anodizing of CIGS type compound materials leaves behind conductive residues comprising metallic species of Cu, In or Ga at the etched location that actually may make shorting even worse than before etching. Phillips et al. (U.S. Pat. No. 4,640,002) used a Laser Beam Induced Current (LBIC) technique to locate shorting defects on solar cell structures and then burned the shorts out by using a high power laser beam. A similar approach is recently used in US Patent Application 2007/0227586. Hjalmar et al. (U.S. Pat. No. 6,750,662) scanned the surface of Si solar cells with a voltage point probe and applied a voltage or light bias (illumination) detecting areas with shunts. This approach may work for thick crystalline solar cells, but would damage thin film devices. Glenn et al. (U.S. Pat. No. 6,225,640) used electroluminescence imaging on completed solar cells and removed detected defects chemically. Again such an approach is not applicable to flexible thin film devices such as CIGS cells, because as will be discussed later, defects in such thin film structures need to be detected and fixed before the solar cell is actually completed. Zapalac (US Patent Publication 2007/0227586) used laser scanning to determine shunts on finished solar cells and described ways of shunt removal by ablation or scribing.

As the brief review above shows, the importance of detection and removal of shunt defects in solar cells has been recognized for many years. Much of the work has concentrated on standard Si solar cells and techniques have been developed to detect shunts in finished devices. In thin film structures using CdTe, polycrystalline Si, amorphous Si, and CIGS absorber layers, the nature and chemical composition of the layers within the device structure are widely different, changing from a single element (Si), to more complex compounds such as a binary compound (CdTe), a ternary compound (CIS), a quaternary compound (CIGS), and a pentenary compound (CIGSS). Therefore, one defect removal method which may work for one device may not work for the other. The laser ablation method that is used for shunt removal, for example, is very successful for Si devices because Si can be easily ablated without leaving behind debris that would affect device performance. For CdTe, the process window for laser ablation is narrow because there is the possibility of formation of conductive debris comprising metallic Cd and/or Te at the location where laser ablation is performed. There is to date no successful laser ablation process for CTGS absorber materials because laser heating of this compound semiconductor leaves behind conductive phases comprising Cu, In, and Ga metals and/or Cu—Se phases. Such conductive phases introduce further shunts in the device structure at the laser ablated locations. Similarly, techniques using chemical etching of defect areas introduce problems for devices employing compound semiconductors such as CdTe and CIGS(S). In such compounds, chemical etching does not etch the material uniformly and leaves behind conductive residue.

Defects reduce the performance of the completed solar cell, and in particular the shunt resistance introduced by defects reduces the fill factor and thus the efficiency of the device. Some prior art methods used chemical approaches to etch away or anodize at least one of the transparent conductive layer, the absorber layer or the contact layer of the solar cell at the exact location of the defect with the goal of passivating the defect. In another approach a laser was used to ablate the defective region. Yet another technique applied a physical tool such as a scriber on the defect with the goal of physically eliminating it. Such approaches do not yield good results for thin film solar cell structures, especially for devices employing compound semiconductor absorber layers constructed on conductive foil substrates. For example, for a CIGS-type solar cell fabricated on a 25-100 µm thick metallic foil substrate, chemical etching or anodization methods do not work well because CIGS is made of Cu, In, Ga and Se and chemical or electrochemical etching of this compound material does not remove all these different materials at the same rate and leaves behind residues that may be conductive. Therefore, while removing a shorting defect, new shorts may be introduced in the device structure where the chemical or electrochemical etching process is performed. Furthermore, if the defect is under the grid pattern, etching techniques cannot be used because etching the grid which is a thick layer is not very practical. Mechanical processes that try to scratch away the defect may introduce even more defects, especially since the defect itself comprises highly conductive debris shorting the device. Physical scratching right on the defect actually smears such conductive debris and often makes the electrical shorting even worse in thin film solar cell structures.

An exemplary CIGS type solar cell, for example, typically has a 100-300 nm thick transparent conductive layer, a 50-100 nm thick buffer layer, a 1000-2000 nm thick absorber layer and a 200-500 nm thick contact layer. The substrate is typically 25-100 µm thick and the grid pattern has a thickness in the 5-50 µm range. In such thin and flexible device structures scribing over the defect with a mechanical tool peels off and damages the various device layers mentioned above at the vicinity of the defect which already has a shorting path for the electrical current, and also damages the metallic substrate which is flexible and pliable. Such damage from the conducting parts of the solar cell may create conductive debris shorting the top surface of the device to the substrate, the debris originating from the damaged substrate region, the contact layer as well as the transparent conductive layer and especially the portion of the grid pattern damaged by the scribing tool. Laser approaches used to remove defects from standard solar cells also do not work well for foil based thin film devices such as CIGS type devices. First of all, adjustment of the laser power to remove only the top transparent conductive layer or the grid pattern at the defect region is very difficult, and sometimes impossible. Laser beam heating of the grid pattern and/or the metallic substrate; may cause local melting of the metal substrate and cause new shorting defects. Laser removal of CIGS itself may create conductive debris around the removal area comprising metallic species such as Cu, In, and Ga. Such conductive debris is a source of new shorting defects in the device structure. Especially the most serious shorting defects which are under the grid pattern may not be removed by laser processes.

Therefore, there is a need to develop defect detection and passivation approaches that are specifically suited for CIGS-type thin film device structures on flexible foils.

SUMMARY

The present inventions relate to methods and apparatus for detecting and efficiently removing defects in a thin film solar cell such as a Group IBIIIAVIA compound thin film solar cell to improve its efficiency.

In one embodiment there is provided a method of manufacturing a high efficiency solar cell comprising the following: 1) providing a solar cell structure with grid pattern, wherein the solar cell structure with grid pattern includes a back portion having a substrate and a contact layer and a front portion having an absorber layer, a transparent conductive layer and a grid pattern or a finger pattern, 2) determining a location of an efficiency reducing defect in the front portion of the solar cell structure with grid pattern, and 3) removing a segment of the solar cell, the segment including the defect, and the front and back portions of the solar cell at the location of the defect.

In another embodiment there is provided a method of manufacturing a high efficiency solar cell in a continuous manner comprising the following: 1) providing a continuous flexible solar cell structure with grid pattern, wherein the continuous flexible solar cell structure with grid pattern includes a back portion having a substrate and a contact layer and a front portion having an absorber layer, a transparent conductive layer and a finger pattern, 2) advancing a section of the continuous flexible solar cell structure with grid pattern over a platform. 3) applying an input signal to the section, 4) sensing an output signal from the section by a detector. 5) processing the output signal sensed by the detector to determine a location of an efficiency reducing defect in the front portion of the section of the continuous flexible solar cell structure with grid pattern, and 6) removing a segment of the continuous flexible solar cell structure with grid pattern, the segment including the defect, and the front and back portions of the continuous flexible solar cell structure with grid pattern at the location of the defect.

In different embodiments, different types of input signals can be input and corresponding output signals can be detected. For example, the input signal can induce one of infra-red (IR) radiation, photoluminescence and electroluminescence as the output signal.

DETAILED DESCRIPTION

The embodiments described herein provide defect detection processes, apparatus to detect defects in solar cell structures and methods and apparatus to passivate that defect. In some embodiments, instead of passivating the defect, the whole solar cell structure including the substrate is removed around the detected defect. Embodiments involving removal of the whole solar cell structure around the defect are especially suited for flexible thin film solar cell structures built on flexible thin film substrates such as polymeric substrates and metallic substrates. Such polymeric substrates include, but are not limited to polyimide-based high temperature substrates, and the metallic substrates include but are not limited to stainless steel, titanium, molybdenum, and aluminum based conductive substrates. The semiconductor absorber layers of such flexible substrates may include CIGS type materials, cadmium telluride type Group II-VI materials, amorphous Si, polycrystalline or microcrystalline Si, organic semiconductors, and absorber layers employed in dye-cells such as dye-titanium oxide containing layers.

In one embodiment a roll-to-roll defect detection and passivation apparatus may be used to detect and passivate the defects formed within a flexible continuous workpiece including a stack of a base, a CIGS absorber formed on the base and a transparent conductive layer formed on the CIGS absorber layer. During the process, initially a section of the continuous flexible workpiece is made substantially flat and an input signal from a signal source is applied to a front surface of the section. The front surface may be the top surface of the transparent conductive layer or a surface of a temporary layer coated on the transparent conductive layer. In response to the input signal, an output signal is generated from a predetermined area of the front surface and detected by a defect detector. The output signal carrying the defect position information is transmitted to a computer and registered in a database. With the position information, an injector device is driven to the defect location to apply an insulator material, preferably an insulating ink, to passivate the defect. If the surface has a temporary layer, the passivation process is performed after removing the temporary layer. A grid pattern layer may be formed over the predetermined area after completing the defect detection and passivation processes.

Figure 1:
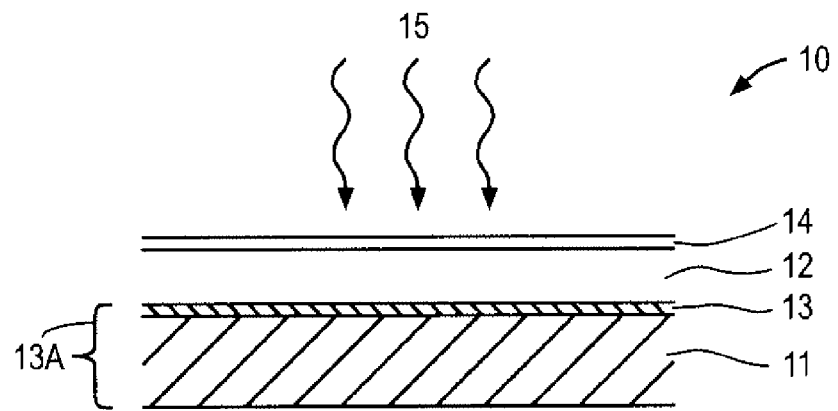
FIG. 1 is a cross-sectional view of an exemplary thin film solar cell employing a Group IBIIIAVIA absorber layer.
Figure 2:
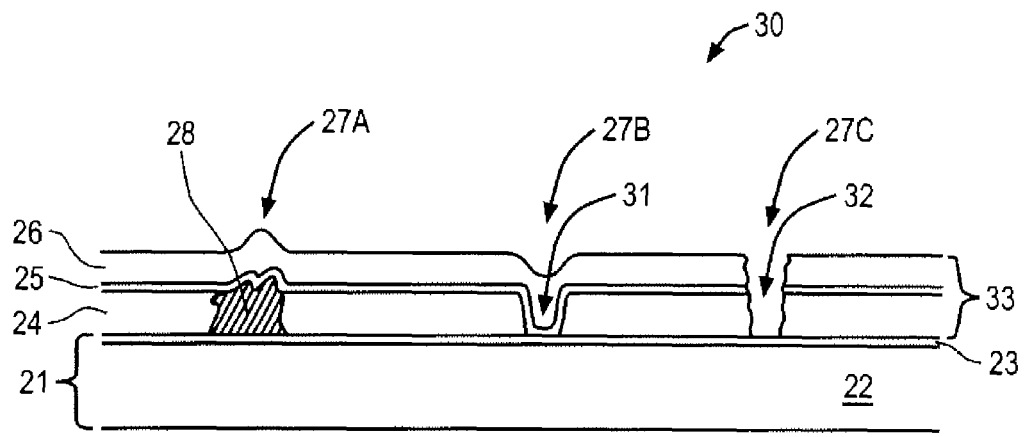
FIG. 2 shows a section of a solar cell structure with three different exemplary types of defects.

Certain aspects of the embodiments will now be described using a solar cell structure 30 shown in FIG. 2. FIG. 2 shows a cross sectional view of an exemplary section of a solar cell structure 30 with three different exemplary defect regions, 27A, 27B and 27C. The solar cell structure 30, which may be a CIGS thin film solar cell structure, comprises a base 21 which includes a substrate 22 and a contact layer 23. An absorber layer 24 or CIGS layer is formed on the contact layer 23. It should be noted that the solar cell structure 30 is only exemplary and the embodiments may be applied to many other thin film solar cell structures utilizing other solar cell absorber layers. A buffer layer 25 such as a CdS layer and a transparent conductive film 26 such as a transparent conductive oxide (TCO) film are then deposited over the CIGS layer 24. The TCO film 26 may be a ZnO film, an indium tin oxide (ITO) film, or a TCO stack film, such as an "undoped ZnO/ doped ZnO" stack film or a ZnO/ITO stack film, etc.

As shown in FIG. 2, a conductive particle 28 over the contact layer 23 causes the defect region 27A to form. The conductive particle may be introduced during or before the deposition of the CIGS layer 24. Alternately, the conductive particle 28 may be inadvertently introduced during the deposition of the contact layer 23, and therefore, it may be in or under the contact layer 23. Regardless of how it may be introduced, the conductive particle 28 establishes a conductive path between the TCO film 26 and the contact layer 23. Presence of the buffer layer 25 in this conductive path may increase its resistance. However, since the thickness of the buffer layer 25 is typically less than 100 nm, it is generally not adequate to fully eliminate the conductive path between the TCO film 26 and the contact layer 23 in the defect region 27A. Defect region 27B in FIG. 2 may be formed by the presence of a pinhole 31 in the CIGS layer 24. The pinhole 31 may be formed during or after the deposition of the CIGS layer 24 and the cavity formed by the pinhole 31 may be filled by the buffer layer 25 and the TCO film 26 during subsequent process steps. Alternately the pinhole 31 may form during or after the deposition of the buffer layer 25, in which case, its cavity would be filled only by the TCO film 26. In any case, as can be seen from FIG. 2, the pinhole 31 filled by the TCO film 26 introduces a conductive path between the TCO film 26 and the contact layer 23. Presence of the buffer layer 25 in this conductive path may increase its resistance. However, since the thickness of the buffer layer 25 is typically less than 100 nm, it usually is not adequate to fully eliminate the conductive path between the TCO film 26 and the contact layer 23 in the defect region 27B. Defect region 27C in FIG. 2 may be formed by the presence of a void 32 in the "CIGS layer/buffer layer/TCO film" stack 33. The void 32 may be formed during or after the formation of the TCO film 26. The void 32 may not be filled by any conductive material, and therefore, there may not be a conductive path between the TCO film 26 and the contact layer 23 through the void 32 at the defect region 27C. However, this situation may change when a finger pattern or grid pattern is deposited over the TCO film 26, as will be described next.

Figure 3:
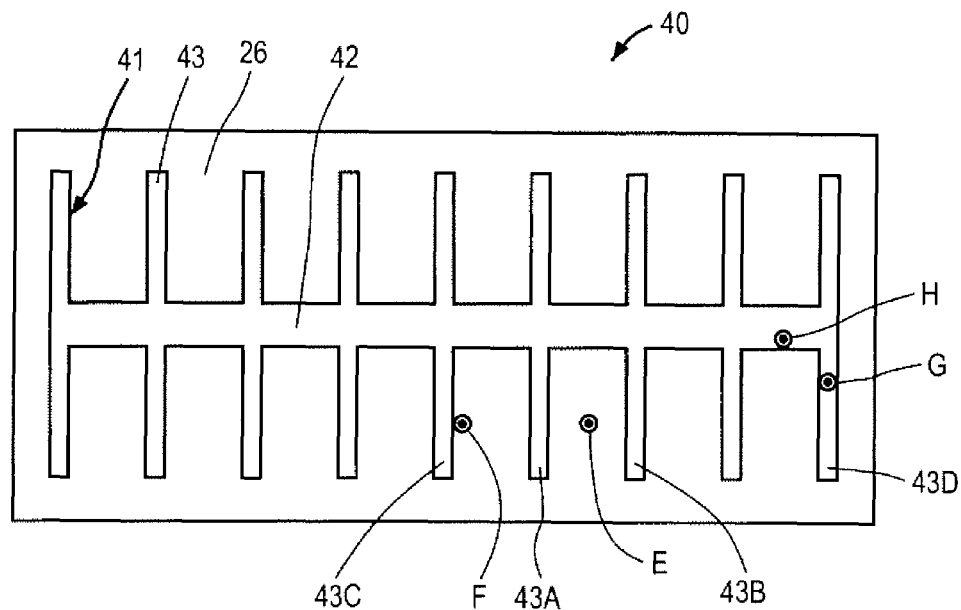
FIG. 3 shows a top view of a thin film solar cell with a grid pattern.

FIG. 3 shows a top view of an exemplary CIGS solar cell 40. The CIGS solar cell 40 may be obtained by depositing a grid pattern 41 on the TCO film 26 of the solar cell structure 30 depicted in FIG. 2. The grid pattern 41 typically comprises one or more, 1-4 mm wide busbars 42, which are the main carriers or conduits of the light generated and collected current of the device, and multiple narrow fingers 43, which may be 50-200 micrometers wide and distributed in specially designed patterns on the top surface of the TCO film 26 to collect the light generated current with minimal electrical loss and to deliver it to the busbars 42. As is well known in the field, the grid pattern 41 is designed to maximize the amount of light shining on the TCO film 26 (i.e. to minimize the shadow loss) and at the same time to minimize the overall series resistance of the solar cell 40. Finger patterns or grid patterns comprise highly conductive metals such as Ag, Ni, Cu, etc., and are deposited by techniques such as evaporation, electroplating, ink jet writing and screen printing. Ink jet writing and screen printing approaches usually employ Ag-particle based inks or pastes that are deposited on the surface of the TCO film 26 in the form of the grid pattern 41. In any case, the busbars 42 and fingers 43 are designed to be highly conductive since their purpose is to lower the series resistance of the device and transmit the current with minimal "I.R" loss. Materials employed in the structure of the grid pattern 41 have bulk resistivity values in the order of $10^{-5}$-$10^{-6}$ ohm-cm. The sheet resistance of the fingers 43 and the busbars 42 may be typically less than 0.01 ohms/square. The typical sheet resistance of the TCO film 26, on the other hand, may be in the range of 10-100 ohms/square, which is at least 1000 times larger than the sheet resistance of the grid pattern 41.

The exemplary defect regions 27A, 27B and 27C of FIG. 2 may further influence the completed device performance once the grid pattern 41 including a busbar 42 and fingers 43 is deposited on the TCO film 26 to form the solar cell 40 shown in FIG. 3. This may be shown using four exemplary locations on the solar cell 40, which are labeled as location E, location F, location G and location H.

If the exemplary defect region 27A described above were located at the location E, although it is away from the busbar 42 and between the two fingers 43A and 43B, the solar cell performance could be affected. As explained before, there is a conductive path between the TCO film 26 and the contact layer 23 at the defect region 27A. However, this shunting path can affect a small area of the solar cell 40 in the near vicinity of the location E. This is because the sheet resistance of the TCO film 26 is relatively high and the current collected by the TCO layer 26 between the finger 43A and finger 43B mostly chooses to flow towards these two fingers and the busbar 42, which have much lower resistance than the TCO film 26. Therefore, the defect region 27A at the location E may affect the solar cell performance, but it does not totally short circuit the device.

If the defect region 27A were at the exemplary location F which is next to finger 43C, its influence on the cell performance would be worse compared to the case discussed above, because the resistance between the finger 43C and the defect region 27A is much smaller due to the shorter distance between them. If the defect region 27A was at the location G or the location H, which are under the finger 43D and the busbar 42, respectively, it would greatly influence the performance of the solar cell 40. In this case, the very low resistance finger 43D and busbar 42 are directly over the defect region 27A, and thus the current collected by the finger 43D and the busbar 42 has a direct low resistance path to the contact layer 23. This is shunting and it is expected to reduce the fill factor, voltage and the conversion efficiency of the solar cell 40 greatly.

If the defect region 27B described above is at the exemplary location E, which is away from the busbar 42 and between the two fingers 43A and 43B, it may affect the solar cell performance. As explained before, there is a conductive path between the TCO film 26 and the contact layer 23 at the defect region 27B. However, this shunting path can affect only a small area of the solar cell 40 in the near vicinity of the location E. This is because the sheet resistance of the TCO film 26 is relatively high and the current collected by the TCO layer 26 between the finger 43A and finger 43B chooses to flow towards these two fingers and the busbar 42 which have much lower resistance than the TCO film 26. Therefore, the defect region 27B at the location E may affect solar cell performance, but it does not totally short circuit the device. If the defect region 27B was at the location F, which is next to the finger 43C, its influence on the cell performance could be worse compared to the case just discussed, because the resistance between the finger 43C and the defect region 27B is much smaller due to the shorter distance between them. If the defect region 27B was at the location G or the location H, which are under the finger 43D and the busbar 42, respectively, it would greatly influence the performance of the solar cell 40. In this case, the very low resistance finger 43D and busbar 42 are directly over the defect region 27B, and thus the current collected by the finger 43D and the busbar 42 has a direct low resistance path to the contact layer 23. This is shunting and it is expected to reduce the fill factor, voltage and the conversion efficiency of the solar cell 40.

The defect region 27C described above may be at the location E, which is away from the busbar 42 and between the two fingers 43A and 43B. In this case, as explained before, there is not a conductive path between the TCO film 26 and the contact layer 23 at the defect region 27C. Therefore, the void 32 at the defect region 27C does not generate photocurrent, but it does not introduce any shunting either. Since the size of the void 32 is typically much smaller than the total area of the solar cell 40, the loss of photocurrent is usually insignificant. For example, for a 100 $cm^2$ area solar cell, a 100 micrometer diameter void introduces only 0.00008% reduction in the generated photocurrent and it does not introduce any shunt at the location E. The situation does not change even if the defect region 27C was at the location F which is next to the finger 43C, i.e. the void 32 at the defect region 27C does not generate photocurrent, but it does not introduce any shunting either. If the defect region 27C was at the location G or at the location H, which are under the finger 43D and the busbar 42, respectively, the situation changes drastically. In this case the defect region 27C may greatly influence the performance of the solar cell 40. Specifically, as the busbar 42 and the finger 43D are deposited over the TCO film 26, the conductive materials such as Ag-filled inks or pastes constituting the grid pattern material, flow into the void 32 and establish a highly conductive shorting path between the grid pattern 41 and the contact layer 23 at the locations G and H. Thus the current collected by the grid pattern 41 find a direct low resistance path to the contact layer 23. This is shunting and it is expected to reduce the fill factor, voltage and the conversion efficiency of the solar cell 40.

In addition to the defect types exemplified in FIGS. 27A, 27B, and 27C, there is an additional type of shunting defect called a weak diode. This defect is created when a defective junction in a small region of the surface has a lower open circuit voltage Voc than the surrounding area. For example, the open circuit voltage within a region a few microns across may be 300 mV rather than 600 mV. Under these conditions the defective region becomes forward biased by the higher Voc of the surrounding area and thereby shunts the current to the back contact.

As the discussion above indicates, defects in a thin film solar cell structure negatively impact the solar cell performance, especially when any section of a grid pattern is formed on such defects. Therefore, detection and passivation of such defects in the solar cell structure are needed.

In an embodiment, a solar cell structure is first fabricated without a grid pattern. Before the grid pattern is formed on the cell structure, a defect detection process is carried out. This process identifies the locations of the defects in the solar cell structure which may or may not be shunts, but would create shunts after finger pattern deposition. A defect passivation process may then be carried out to passivate at least some of the defects that are detected. A grid pattern is then formed on the window layer.

Figure 4:
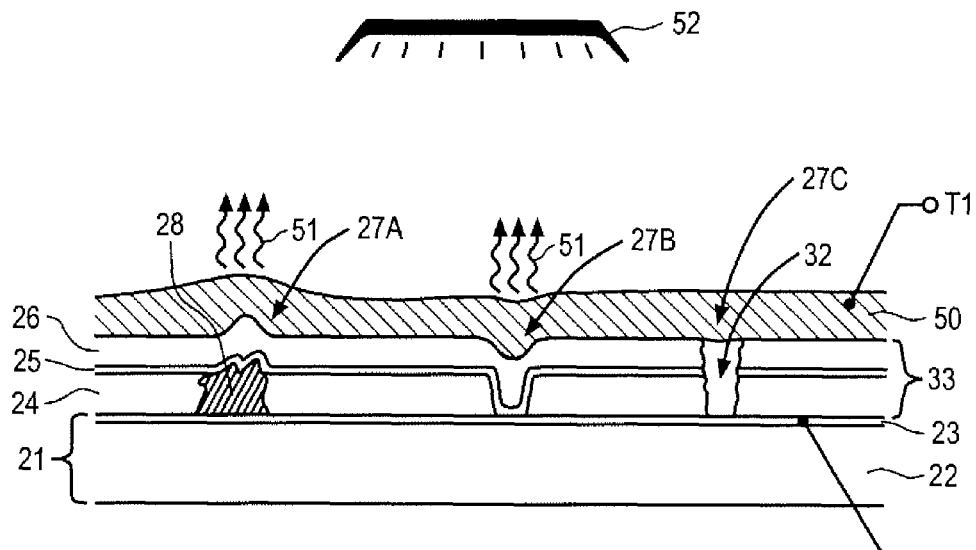
FIG. 4 shows a method of detecting defects in thin film solar cells.

FIG. 4 shows a method and apparatus to detect at least some of the defect regions that were discussed with reference to FIG. 2. As can be seen from FIG. 4, a temporary conductive blanket 50 is formed over the solar cell structure 3) of FIG. 2. In FIG. 4, the exemplary temporary conductive blanket 50 is a conductive and flexible foil such as a 10-75 micrometer thick metal foil that establishes good physical and electrical contact with the top surface of the TCO film 26. A first terminal T1 is attached to the temporary conductive blanket 50 and a second terminal T2 is attached to the contact layer 23. If the substrate 22 is a conductive foil, the second terminal T2 may be attached to the substrate 22 instead of the contact layer 23. Next, a voltage bias is applied between the first terminal T1 and the second terminal T2. It is preferable that this applied voltage biases the solar cell structure 30 in a voltage range that does not allow appreciable current passing through the device. In other words, the voltage applied either reverse biases the device or if it forward biases it, it applies a voltage that is smaller than the turn-on voltage of the diode. Since there are conductive paths between the TCO film 26 and the contact layer 23 at the defect region 27A and the defect region 27B, a shunt current passes between the temporary conductive blanket 50 and the contact layer 23 through the defect regions 27A and 27B. The shunt current heats up the portions of the temporary conductive blanket 50, right over the defect regions 27A and 27B. A strategically located IR camera 52 detects the IR radiation 51 emanating from these heated defect regions. In a particular embodiment, the applied bias can be modulated and the images from the IR camera processed in such a way as to "lock-in" on the modulated signal from the shunt. This technique may yield improved shunt detection. In another embodiment, the transparent conductive blanket can be replaced with a rolling contact, or pair of rolling contacts that stretch across the width of the cell. Conductive brushes may also be utilized as a substitute for the roller. As the moving temporary contact passes over or near the shorting defect region, the region gets heated and the IR camera detects the heated defect region.

The information about the location of the shunt defects may be saved by a computer and this location information may later be used to passivate the defective regions after the temporary conductive blanket 50 is removed from the top surface of the TCO film 26. It should be noted that the exemplary temporary conductive blanket 50 of FIG. 4 is a flexible foil and it may not fill the void 32 of the defect region 27C, and therefore cannot establish an electrical short circuit with the contact layer 23 through the void 32. Consequently, no shunting current passes through the defect region 27C upon application of a voltage between the terminals T1 and T2. As a result, this defect region may go undetected. To be able to detect defects such as the one at defect region 27C, it is preferable to use a temporary conductive blanket which may be in the form of a liquid or gel. This way the material of the conductive blanket would go into the void 32 and establish a short circuit between the conductive blanket and the contact layer 23. When shorting current passes through, it would heat the defect region 27C and the IR camera, operating either in DC or AC "lock-in" mode, depending on the type of bias utilized (DC or AC) could detect this heating.

Figure 5:
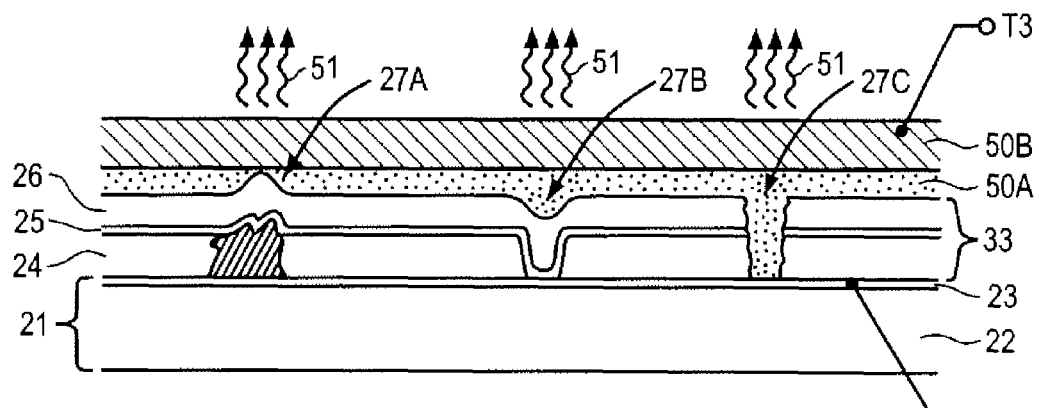
FIG. 5 is shows another method of detecting defects in thin film solar cells.

It is also possible to use a combination of different types of temporary conductive blankets. In FIG. 5, for example, a temporary conductive liquid blanket 50A is used in conjunction with a temporary conductive solid blanket 50B. The temporary conductive liquid blanket 50A may be an ionic liquid, a salt solution, etc., which has enough conductivity to allow a shunt current to pass through it but is inert and does not etch or anodize any of the solar cell layers (23, 24, 25, 26). The temporary conductive solid blanket 50B may be a thin (10-50 micrometers) metallic foil. A terminal T3 may be attached to the temporary conductive solid blanket 50B and a terminal T4 may be attached to the contact layer 23. If the substrate 22 is a conductive foil, the terminal T4 may be attached to the substrate 22 instead of the contact layer 23. Next, a voltage bias is applied between the terminal T3 and the terminal T4. It is preferable that this applied voltage biases the solar cell structure 30 in a voltage range that does not allow appreciable current passing through the device itself. However, since there are conductive paths between the TCO film 26 and the contact layer 23 at the defect regions 27A, 27B, and 27C, a shunt current passes between the temporary conductive solid blanket 50B and the contact layer 23, through the temporary conductive liquid blanket 50A and the defect regions 27A, 27B and 27C. The shunt current heats up the portions of the temporary conductive solid blanket 50B, right over the defect regions 27A, 27B and 27C. A strategically located IR camera (not shown) detects the IR radiation 51 emanating from all three defect regions. Operation in AC or "lock-in" mode may allow for the use of lower bias to achieve the same signal level for defect detection, reducing collateral damage to the cell. The information about the location of the shunt defects may be saved by a computer and this location information may later be used to passivate the defective regions after the temporary conductive solid blanket 50B and the temporary conductive liquid blanket 50A are removed from the top surface of the TCO film 26.

Figure 6:
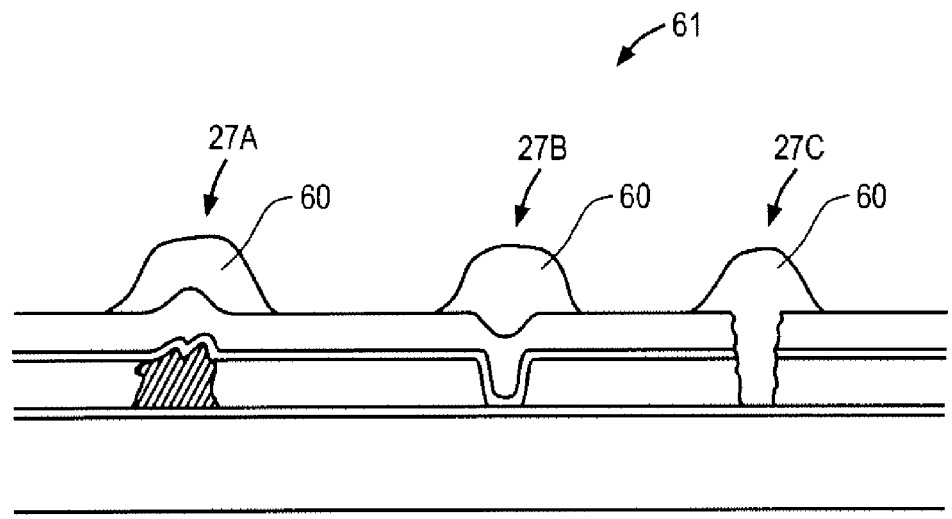
FIG. 6 shows the defects shown in FIG. 2, wherein the defects have been passivated.

After collecting the defect location information, passivation of the defect regions 27A, 27B and 27C may be achieved by forming high resistance caps 60 over them as shown in FIG. 6. The high resistance caps 60 may be applied by various ways including by small injectors or ink jet heads that may travel to the already determined position of the defect and dispense a small amount of a high resistivity material. The high resistivity material may be in the form of an ink which may be later cured by heat or radiation. Ultraviolet curable insulating inks are well suited for this application since they can cure quickly within a few seconds. It should be appreciated that, formation of a grid pattern (not shown) on the defect-passivated solar cell structure 61 of FIG. 6 would not cause shorting or shunting even if the busbars or fingers of the grid pattern directly land on any of the passivated defect areas 27A, 27B and 27C.

Figure 7:
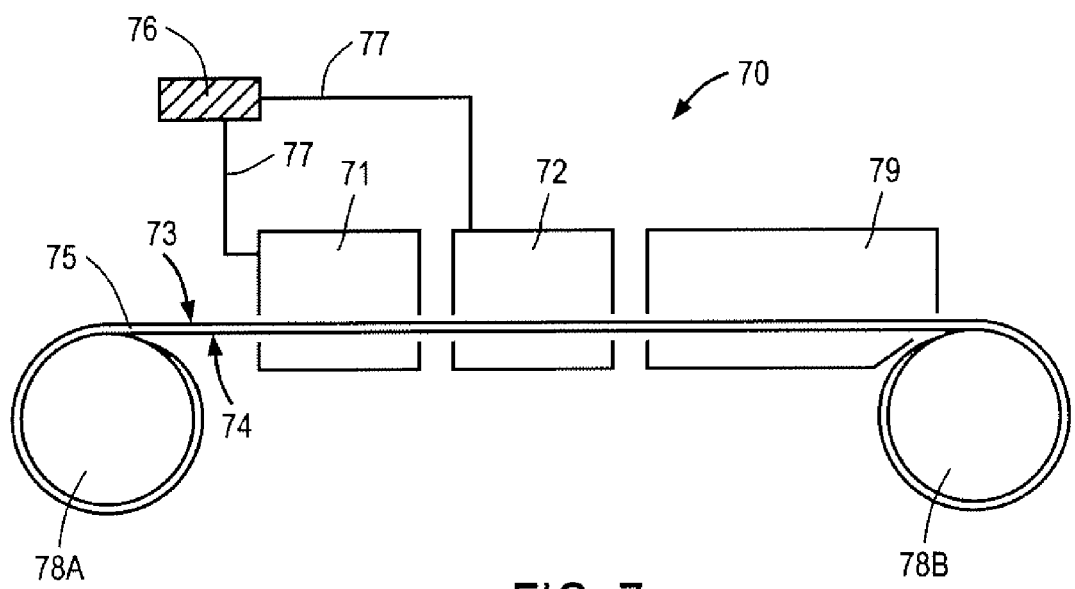
FIG. 7 shows a defect detection and passivation system.

Defect detection and passivation may be carried out on individually cut solar cell structures or they may preferably be carried out in a roll-to-roll manner on a continuous solar cell structure. FIG. 7 shows a roll to roll processing system 70 to detect and passivate defect regions on a workpiece 75 with a top surface 73 and a bottom surface 74. For example, the workpiece 75 may comprise a device structure similar to the solar cell structure 30 shown in FIG. 2. Therefore, the top surface 73 may be the top surface of the TCO film 26 and the bottom surface 74 may be the bottom surface of the substrate 22. The workpiece 75 may be fed by a supply spool 78A and may be rolled back up in a receiving spool 78B after processing. The roll to roll processing system 70 comprises at least one detection station 71 and at least one passivation station 72. As portions of the workpiece 75 travel from the supply spool 78A to the receiving spool 78B either in a continuous motion or in a step-wise motion, they pass through the detection station 71 and the passivation station. Defect regions are detected in the detection station 71, using, for example, the methods described before. A computer 76 is in communication with the detection station 71 and the passivation station 72 through cables 77. The computer 76 may also be in communication with the motion control system (not shown) that controls the motion of the workpiece 75 between the supply spool 78A and the receiving spool 78B. This way the computer 76 gathers the defect location information for a portion of the workpiece measured in the detection station 71 and provides this information to the passivation station 72 so that when that portion of the workpiece is advanced to the passivation station 72, the defect regions identified in the detection station 71 may be passivated. After the passivation of the defect areas, the defect-passivated work piece may be rolled up in the receiving spool 78B and moved to another process station. Preferably, however, the above described detection and passivation processes may be integrated with a grid pattern formation process. In this case, after defect region passivation, the portion of the defect-passivated workpiece moves into a grid application station 79 within which a grid pattern may be deposited and cured on the front surface 73. The grid application station 79 may be a screen printing station, an ink jet writing station and the like, that forms a grid pattern on the defect-passivated portion of the workpiece. Defect detection and passivation may both occur at the same station, for example, at station 71. This reduces the footprint of the tool and, because the web is not moved, this also simplifies the alignment between the detection and passivation steps.

It should be noted that since the solar cell parameters are most negatively impacted by the presence of defects directly under or in close proximity of the grid pattern, defect detection and defect passivation processes may be limited only to these areas. Doing so increases the throughput of the detection and passivation processes compared to the case that carries out such detection and passivation processes over substantially the whole surface of a thin film solar cell structure. In the high throughput process, the location of the grid pattern to be deposited is predetermined and therefore the defect detection and passivation processes are applied to this predetermined location. Considering the fact that grid pattern in a typical solar cell covers only less than 10% of its total area, this approach reduces the area of defect detection and passivation by 90% and increases the throughput of these processes greatly. For example, the roll to roll processing system 70 may be used in this mode to increase its throughput by 10 times or even more. With the increased throughput it becomes feasible to integrate the roll-to-roll defect detection and passivation process with a high speed roll-to-roll finger pattern screen printing process, i.e. carrying out the screen printing step right after the detect passivation step within the same process tool.

Figure 8:
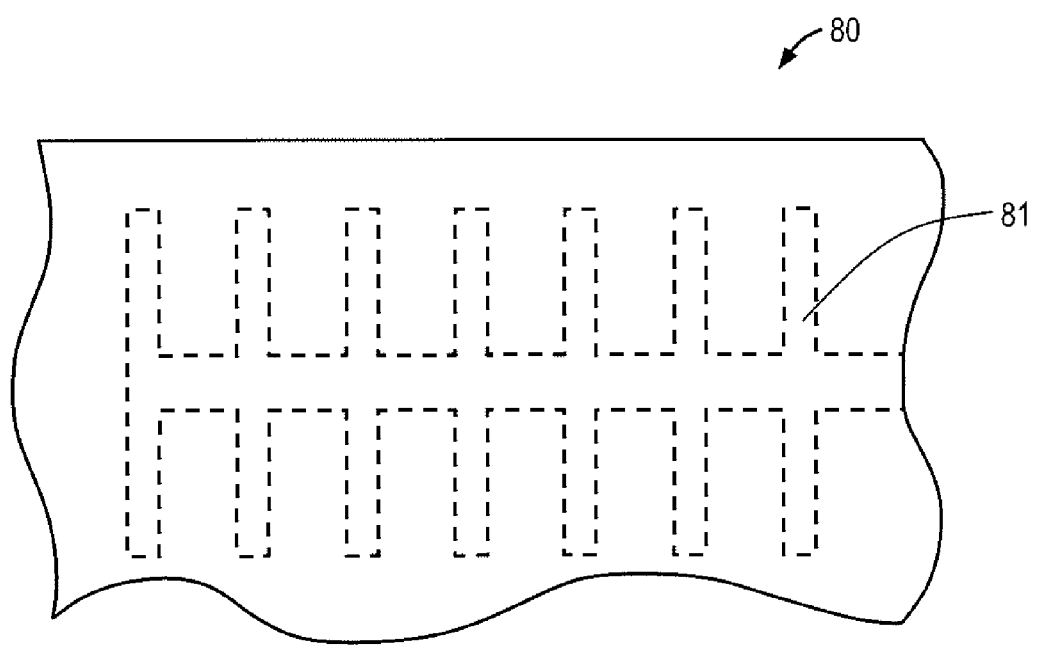
FIG. 8 shows a section of a solar cell structure with a predetermined grid region.

FIG. 8 shows a section 80 of a solar cell structure. The predetermined grid region 81 shown by the dotted lines is a region on the top surface of the section 80 of the solar cell structure, which will receive a grid pattern, such as the grid pattern 41 of FIG. 3, after the step of passivation. The predetermined grid region 81 is substantially the same shape as the grid pattern to be deposited. Preferably, the predetermined grid region 81 is somewhat larger than the grid pattern to assure that when the grid pattern is deposited it falls well within the boundaries defined by the dotted lines in FIG. 8. It is noted that the predetermined grid region 81 is less than 20%, and typically less than 10% of the surface area for a given section. When the section 80 of the solar cell structure is processed in a defect detection station, the process of detection may be applied just to the predetermined grid region 81 finding and locating the defects only in this region, and due to the grid region 81 area being much less than the area of the entire section, as noted by the percentages above, this can allow for significant benefits. For example, if a laser scanning approach such as an LBIC method is used for defect detection, the laser may be scanned only through the predetermined grid region 81 and the positions of the defects identified may be stored by a computer for future use during passivation. Of course, it would also be possible to collect the complete defect data through substantially the whole surface of the section 80 of the solar cell structure but then passivate only the defects falling within the predetermined grid region 81, thus also increasing the throughput of the passivation process. In any case, when the section 80 of the solar cell structure is advanced into a defect passivation process station, defects that fall within the predetermined grid region are passivated by forming high resistivity caps as described before. After defect passivation of the predetermined grid region 81, a grid may be deposited on the predetermined grid region 81. It should be noted that the temporary conductive blankets used for detection of defects in specific regions of a solar cell structure, such as the predetermined grid region 81 of FIG. 8, may be shaped just like that specific region.

The defect region detection methods may be non-contact or contact methods. In non-contact methods, no electrical contact needs to be made to the solar cell structure such as the solar cell structure depicted in FIG. 2. For contact methods, electrical contacts need to be made to the device to carry out a detection procedure. In contact methods one contact is made to the transparent conductive layer (layer 26 in FIG. 2) and the other one to the back contact of the device (layer 23 in FIG. 2). If the substrate is a conductive foil (see substrate 22 in FIG. 2) then the back contact may be made on the exposed back surface of the substrate itself since the substrate and the device contact layer are electrically shorted. A roll-to-roll system will now be described where both contact and non-contact methods may be applied to a flexible CIGS type solar cell structure (such as the one showed in FIG. 2) for the purpose of detecting various defects in the structure. In this example, the detection station 71 and the passivation station 72 of FIG. 7 are merged together and various different detection method examples are given.

Figure 9A:
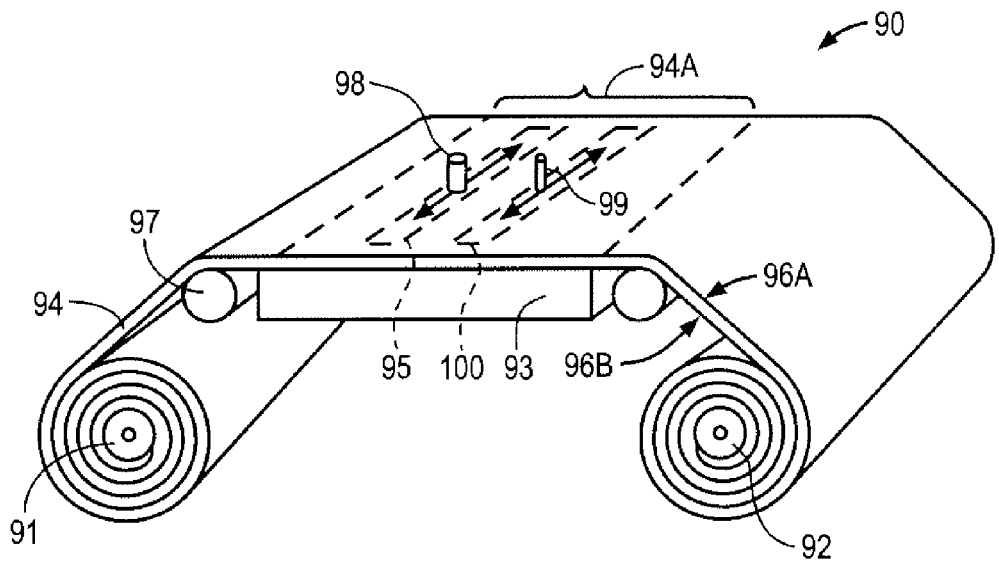
FIG. 9A shows an embodiment of a defect detection tool according to an embodiment.

A roll-to-roll defect detection and passivation system 90 is shown in FIG. 9A. As shown in FIG. 9A, the system 90 comprises a feeding roller 91, a receiving roller 92, and a process platform 93 disposed between the two rollers. A flexible and continuous workpiece 94 is fed by the feeding roller 91 and passes onto the top surface of the process platform 93 and then is rolled back up on the receiving roller 92 by a moving mechanism (not shown). The workpiece 94 includes a front surface 96A and a back surface 96B. The workpiece 94 may comprise a device structure similar to the solar cell structure 30 shown in FIG. 2. Therefore, the front surface 96A may be the top surface of the TCO film 26 and the back surface 96B may be the back surface of the substrate 22. The top surface of the process platform 93 is substantially flat and may include vacuum holes so that when a section 94A of the workpiece 94 is moved on the top surface of the process platform 93 it can be registered flat onto the top surface by applying vacuum to a portion of the back surface 96B that is on the process platform 93. Once the section 94A of the workpiece 94 is registered flat onto the top surface of the platform, defect detection and/or passivation process may be carried out at least over a predetermined portion of the section 94A, which is indicated as detection area 95 in FIG. 9A. The defect detection process may be carried out using a detector 98 which can move across the front surface of the continuous workpiece over a predetermined detection area 95 when the workpiece is at a detection location.

During the defect detection process an input signal is applied from an input signal source to the predetermined detection area, and an output signal from the predetermined area carrying the defect information is collected by the detector. Exemplary input signals may be delivered through shining light onto the detection area or applying a voltage between the detection area 95 and the substrate of the workpiece. If light is used as an excitation source, the wavelength of the irradiation may preferably be in the near infra red (750-900 nm) where the CIGS layer efficiently absorbs light and converts this light to current. This maximizes the thermal signature of the shunts because collateral heating of the cell due to thermalization of hot carriers in the absorber layer is minimized. The output signals may be infra-red (IR) radiation, photoluminescence radiation and electroluminescence radiation and the like, each of which can be operated in DC or AC "lock-in" mode. As sections of the workpiece 94 are advanced from the supply spool 91 to the receiving spool 92 either in a continuous motion or in a step-wise motion, preferably in a step-wise motion, defect detection is carried out in the detection area 95 and the position information of the detected defects carried by the output signal are recorded by a computer (not shown). This position information is then used to passivate the detected defects in a passivation location. When the detection area 95 moves from the detection location to the passivation location of the system by moving the workpiece 94, it becomes passivation area 100. In essence, both the detection area and the passivation area are the same predetermined area on the front surface of the section of the continuous workpiece in two different locations where the detection and passivation processes can be applied. An injector 99 which may be moved across the front surface 96A of the workpiece 94 over the passivation area 100 goes to the position where the defect has been detected and dispenses a high resistivity ink over the defect region. If the ink is a heat-cured or UV-cured type, such curing means may also be applied to the deposited ink (not shown). It should be noted that the detection area 95 and the passivation area 100 may actually be the same area, i.e. both defect detection and passivation may be carried out one after another when the workpiece 94 is kept stationary. However, separating the detection and passivation steps increases throughput. In fact, for higher throughput there may be two or more detection areas with two or more detectors and two or more passivation areas with two or more injectors.

Figure 9B:
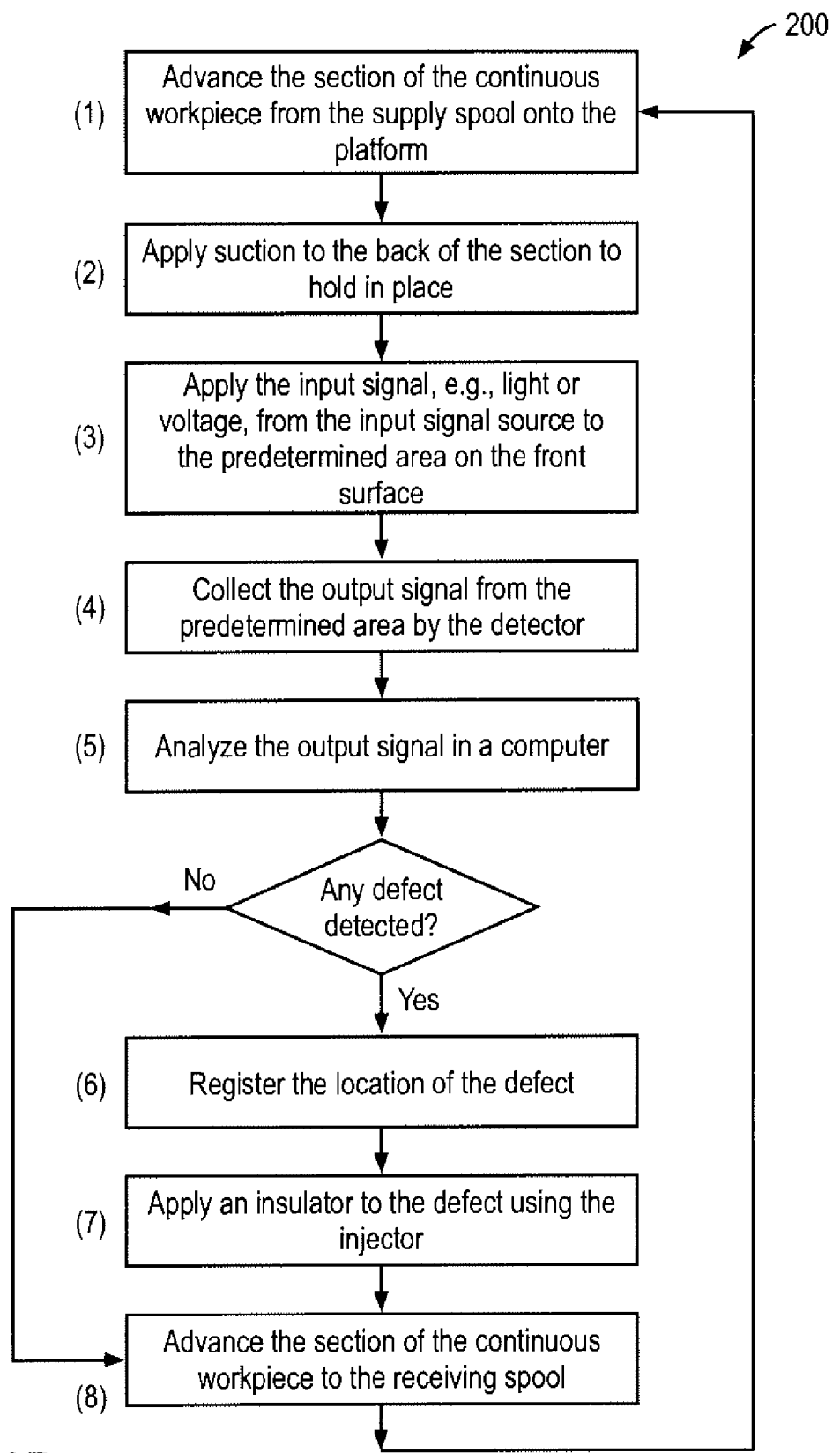
FIG. 9B shows an exemplary process flow using the defect detection tool shown in FIG. 9A.

FIG. 9B shows an embodiment of an exemplary detection process flow 200 using the system shown in FIG. 9A. In step (1), the section 94A of the continuous workpiece 94 is advanced from the supply spool to the surface of the platform 93. In step (2), suction is applied to the back surface of the section 94A so that the section of the continuous workpiece 94 can be made substantially flat and held in place. In step (3), the input signal is applied to a predetermined area on the front surface of the section. The predetermined area may be the area on which a finger pattern will be formed after the detection and passivation process. At this step the signal may be applied to the predetermined area when the predetermined area is at a detection location. In step (4), the detector 98 collects the output signal from the predetermined area, and in step (5), this data is analyzed using a computer. If no defect is detected the process continues with step (8) in which the section 94A is advanced to the receiving spool, and the process restarts with a following section of the continuous workpiece. If a defect is detected, the process is followed with step (6) in which the position of the defect is registered, i.e., the defect's coordinates in the predetermined area is mapped and recorded in the computer's data base. Next, in step (7), using the position information of the defect, a moving mechanism controlled by the computer drives the injector 99 over the position of the defect to apply an insulating material to the defect. Alternatively, before step (7), the predetermined area with the defect may be advanced into a passivation location on the platform 93 to apply the injector 99 while another predetermined area is being processed at the detecting location. Step (7) may also includes a UV cure of the dielectric. As an alternative to the application and cure of a dielectric, removal of the entire segment of the cell to remove the defect could occur during step (7). After the defect is passivated in step (7), the section is advanced in step (8) to the receiving spool. It should be noted that the size of the subject defects may vary widely from a few microns up to 1 mm. The insulator dispensed by the injector on a defect region may be as wide as 1-2 mm or even more. It is preferred that the insulator be transparent. In this case, the current loss in the solar cell is minimized even if the insulator size is much larger than the defect size. For example, a 2 mm diameter insulator drop deposited on a 10 micrometer size defect would not cause any current loss due to the presence of insulator over the TCO layer provided that the insulator is substantially transparent to sunlight. It may be advantageous to scale the diameter of the dielectric cap to the spatial extent of the thermal signature of the shunt. In this way a shunt of restricted spatial extent need only be covered with a smaller area of dielectric, whereas a spatially extended shunt would require a dielectric cap of much larger diameter. This would improve the effectiveness of shunt passivation without compromising throughput.

As mentioned before, it is also possible to integrate defect detection and passivation process with a finger pattern deposition step. In this case, the sections of the continuous workpiece that received defect detection and passivation steps may move to a screen printing/curing unit (not shown) of the overall system before the sections are advanced to the receiving spool.

Figure 10:
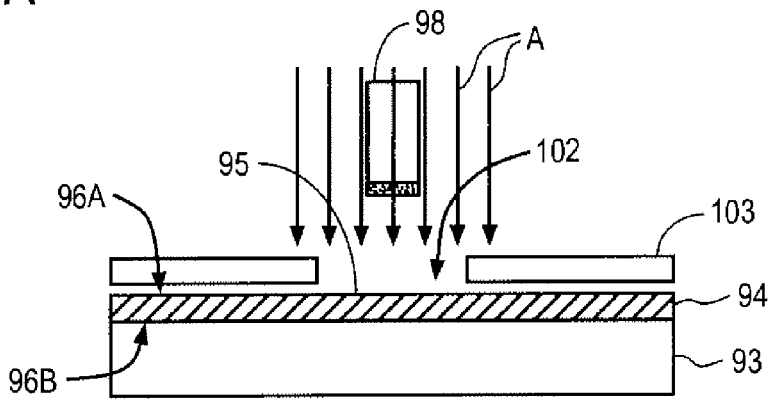
FIGS. 10-11 show various embodiments of the defect detection process and equipment.

It should be noted that the nature of the detector 98 depends on the defect detection method and the input signal source employed. The embodiments may use both non-contact detection methods and contact detection methods. The non-contact defect detection methods may utilize techniques such as photoluminescence and infrared thermography. FIG. 10 schematically shows a detection area 95 and sections of the process platform 93 and workpiece 94 under the detection area 95. Both photoluminescence and IR thermography use illumination, i.e., light photons, as the input signal which is depicted by arrows 'A'. In FIG. 10 the detection area 95 is optionally defined by an opening 102 of a mask 103 placed over the front surface 96A of the workpiece 94. The back surface 96B of the workpiece 94 is on top of the process platform 93. In IR thermography the portion of the solar cell structure of the workpiece 94 within the detection area 95 is illuminated by light coming through the opening 102 of the mask 103 and impinging on the front surface 96A. The impinging light or input signal creates a voltage and a resulting current within the solar cell structure. Light generated current passes through any short circuits in the solar cell structure causing local heating in those locations. The detector 98 in this case is an IR camera which sees and records the heated regions or the short circuits as output signals. It should be noted that this technique can detect short circuits but cannot detect the defects that do not short the TCO layer to the back contact (defect region 27C in FIG. 2).

Another non-contact approach is photoluminescence. In this case light is shone through the opening 102 of the mask 103 as the input signal and the detector 98 detects photoluminescence coming from the solar cell structure as the output signal. In this case all non-active regions, i.e., regions that do not generate photoluminescence, in the solar cell structure including shorted regions and regions comprising foreign particles, etc. may be detected. As mentioned before, these techniques can be operated either in a DC or AC mode. In the latter case the excitation source or input source is modulated, and the images are acquired and processed so as to "lock-in" on the signal of interest, with a substantially improved signal to noise ratio. For the specific CIGS solar cell structure the non-contact detection method using photoluminescence is attractive because it avoids surface damage and can detect defects that are shorts as well as defects that may not be shorts but would create shorts when a finger pattern is deposited. It should be noted that the mask 103 may be in the shape of the predetermined grid region 81 of FIG. 8 to carry out detection and passivation only in this grid region.

Figure 11:
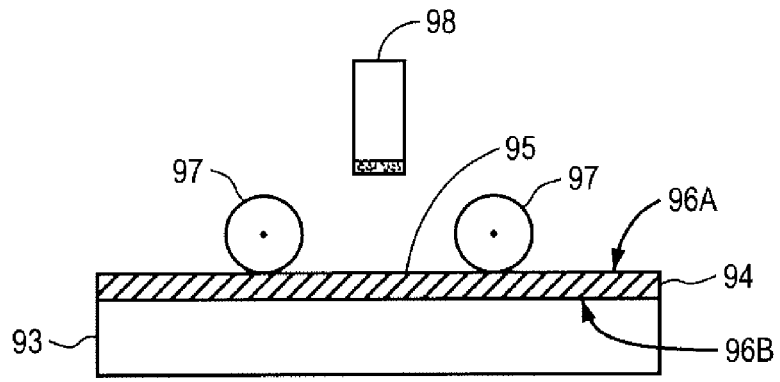

For contact detection methods, electrical contacts need to be made to the top and bottom electrodes of the solar cell structure to provide an input signal. An example is shown in FIG. 11 where the front surface 96A of the workpiece 94 is contacted by highly conductive top contacts 97 and the ohmic contact to the metallic back surface 96B of the workpiece 94 is made by the top surface of the process platform 93, which may be a metallic sheet. As shown in FIG. 11 the top contacts 97 may comprise two or more conductive rollers which are placed on the front surface 96A of the workpiece 94. The area between the two conductive rollers 97 defines the detection area 95. The roller surface may also be coated with a conductive rubber material to reduce damage to the TCO surface. Although the contacts shown in FIG. 11 are rollers, other types of electrical contacts such as brushes, etc. may also be used.

Two exemplary detection methods, thermography and electroluminescence, may use the conductive rollers to generate input signals. In thermography, a voltage is applied between the rollers and a bottom contact to the back surface 96B of workpiece 94. Short circuiting defect regions in the detection area 95 pass higher current than the rest of the device and therefore get hotter. An IR camera is used as the detector to detect the IR radiation from the hot spots as the output signal. If a continuous rolling web were to be imaged in this way, it may be preferable to utilize a line-scan camera of high resolution and sensitivity, placed as closely as possible after the contacting roller, to efficiently detect and precisely localize the shunts before they can cool appreciably. As described above, this technique can detect short circuits effectively. However, defects that do not pass high current in the solar cell structure may go undetected. The second exemplary contact method is electroluminescence where a voltage or input signal is applied between the rollers and a bottom contact to the back surface 96B of the workpiece 94 and an electroluminescence detector senses the radiation or the output signal coming from the detection area 95. Shorted areas as well as areas containing foreign matter may be detected this way as dark, inactive regions of the cell structure. Therefore, electroluminescence detection is preferred for CIGS solar cell structures since it can detect defects that may not be shorts but would create shorts when a finger pattern is deposited. In another embodiment, the above described defect detection methods and techniques may be applied to a completed solar cell structure including a terminal, such as a grid pattern, on the front light receiving surface of the solar cell. In this embodiment, the defect detection process identifies the locations of the efficiency reducing defects such as shunting defects in the completed solar cell structure with the grid pattern on the top. The defects may be under, adjacent to or away from the grid pattern. With this defect location information, a cutting apparatus, described further hereinafter, is used to remove the defect containing segments of the solar cell. The removed segment includes portions of the substrate material, contact material, absorber material, transparent conductive layer and it may include a portion of the terminal, as shown and described hereinafter in FIGS. 13a and 13b. Before removing the defect containing segments of the solar cell, a stabilizer layer may be used to coat the solar cell so as to remove the segments without generating small segments and prevent cracks around the cut lines. The stabilizer layer may be a permanent or removable insulating layer deposited before the cutting operation. The cutting process may be conducted in a cleaning solution to remove small dust or material pieces resulting from the cutting process. The cutting process may further be conducted in a mildly acidic solution to dissolve small particles resulting from the cutting process. The cutting process may alternatively be conducted in a manner that coats the tip and sides of a puncher with a curable liquid dielectric after the punch passes through the cell, so that dielectric coats and insulates the sides of the hole as the puncher is withdrawn through the cell. The holes left behind after the removal of the defect containing segments, described further hereinafter, may be filled and sealed with a hole filling process before encapsulating such defect free cells to form solar cell modules including multiple solar cells.

Figure 12A:
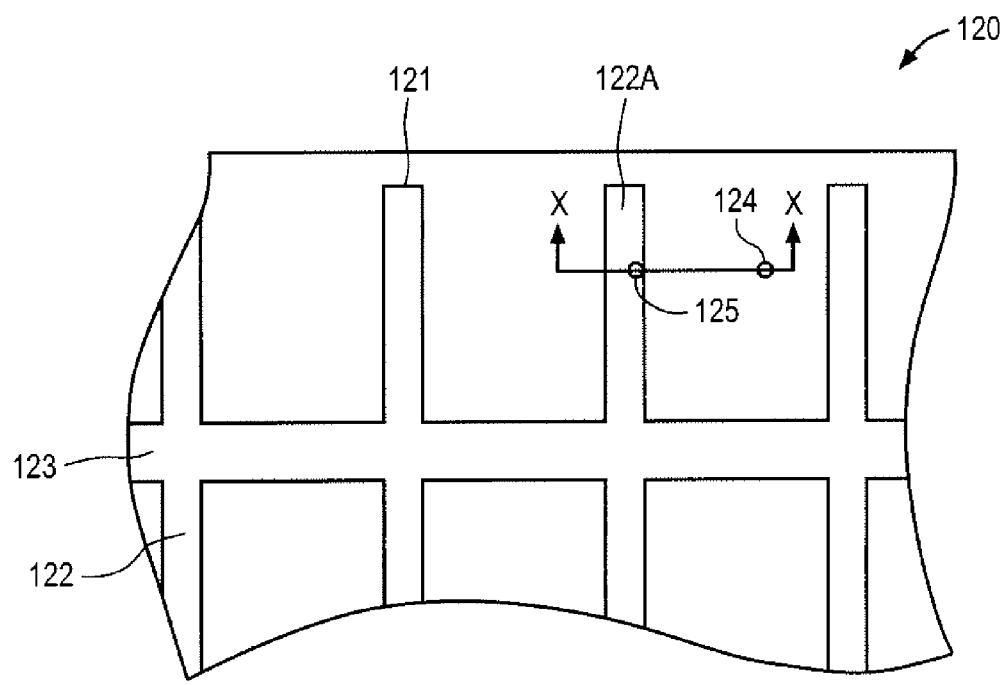
FIGS. 12A and 12B show the top plan view and a cross sectional view, respectively, of a portion of a solar cell with two exemplary defects.
Figure 12B:
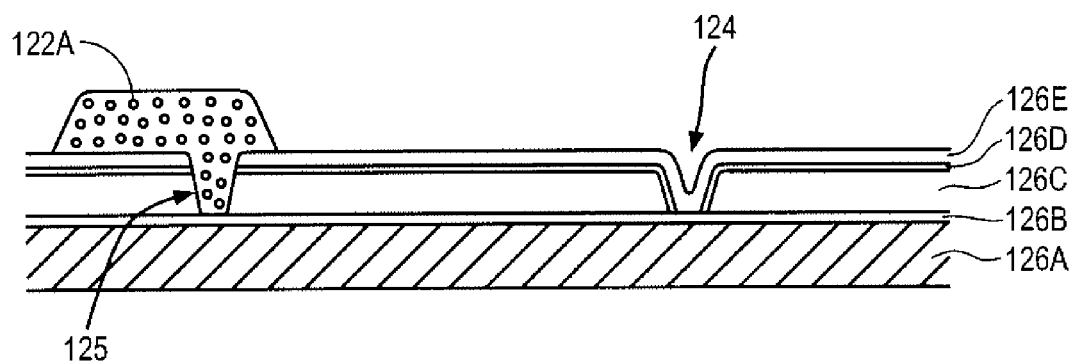
Figure 13A:
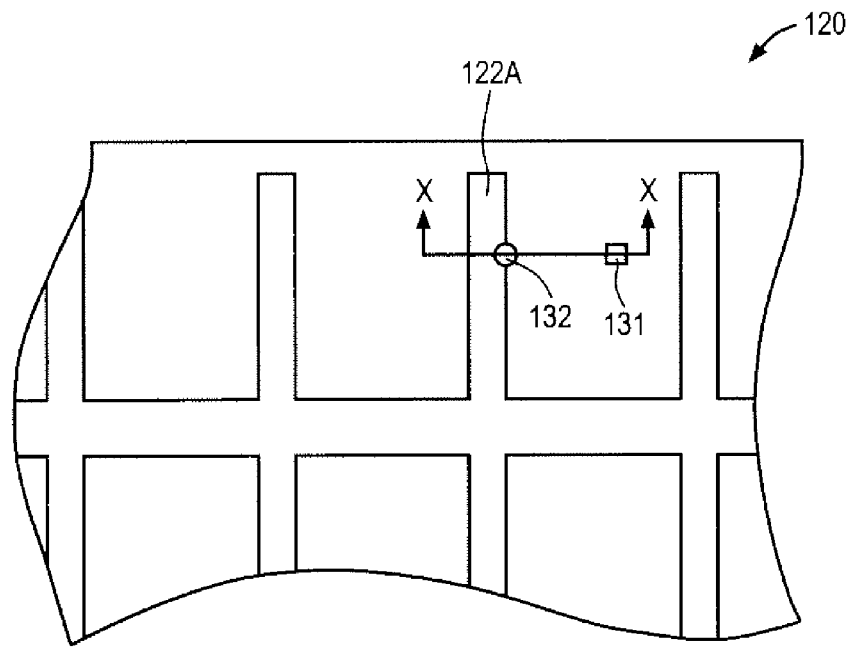
FIGS. 13A and 13B show the top plan view and a cross sectional view, respectively, of the portion of the solar cell of FIGS. 12A and 12B after the removal of two segments of the device along with the exemplary defects.
Figure 13B:
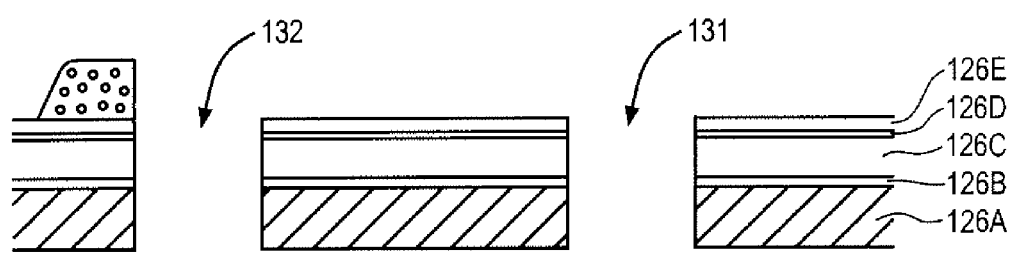

FIG. 12A shows a top (illuminated surface) view of a portion 120 of a solar cell structure with grid pattern, also referred to as a completed solar cell. The portion 120 of the completed solar cell comprises a grid pattern 121 which includes fingers 122 and at least one busbar 123. There are two exemplary defects shown in FIG. 12A. The first defect 125 may be under the finger 122A of the grid pattern 121. The second defect 124 may be between two fingers. A cross sectional view taken across the line "X-X" in FIG. 12A is shown in FIG. 12B. As can be seen in FIG. 12B, the portion 120 of the completed solar cell has a structure comprising a substrate 126A, a contact layer 126B, an absorber layer 126C (such as a CIGS type absorber layer), a buffer layer 126D (such as a sulfide compound layer like cadmium sulfide or indium sulfide) and a transparent conductive layer 126E (such as a transparent conductive oxide like zinc oxide, indium tin oxide, indium zinc oxide, etc.). The completed solar cell is preferably a thin film solar cell and the substrate 126A is a conductive or insulating foil substrate with a thickness typically smaller than 250 um, preferably smaller than 100 um. The conductive foil substrate may be made of metals and/or alloys comprising steel, stainless steel, molybdenum, titanium, copper, aluminum, etc. If the substrate 126A is an insulating foil it may comprise a polymeric material such as polyimide. Kapton-type materials supplied by companies, such as DuPont, are suitable for this application. As can be seen from FIG. 12B the first defect 125 under the finger 122A may be a pinhole or hole through which the finger 122A may electrically short to the contact layer 126B and/or the substrate 126A. It should be noted that grid patterns are highly conductive and they generally comprise silver metal. The second defect 124 may be a hole through which the transparent conductive layer 126E may electrically short to the contact layer 126B and/or the substrate 126A. Various other types of defects such as those discussed with reference to FIG. 2 may also exist in the completed solar cell. The presence and the locations of the first defect 125 and the second defect 124 may be determined using the defect detection techniques discussed in the above embodiments. Defects such as the first defect 125 and the second defect 124 reduce the performance of the completed solar cell. The low shunt resistance introduced by such defects reduces the fill factor and thus the efficiency of the device. In an embodiment detected defects in a completed solar cell structure are completely removed by completely removing a segment of the solar cell containing the defect. FIGS. 13A and 13B shows the portion 120 of the completed solar cell structure of FIGS. 12A and 12B after the steps of removing the first defect 125 and the second defect 124. As can be seen from these figures, to achieve the defect removal process two segments of the solar cells, one around the first defect 125 and the second one around the second defect 124, are totally removed leaving behind a first hole 132 and a second hole 131. The holes can be in various shapes. The exemplary first hole 132 is shown as a round hole and the second hole 131 is shown as a rectangular hole in the figure. Removed segments include the defects, as well as small pieces of the components and layers of the solar cell structure including the substrate, the contact layer, the absorber layer, the buffer layer and the transparent conductive layer. The segment removed from the location of the first defect 125 further comprises a piece of the finger 122A. The removed segments or the holes left behind may have areas as small as 0.002 cm$^2$ or less, and as large as several cm$^2$. It is preferable that the area removed to be at least at least about twice the area of the defect, preferably more than four times the area of the defect. Preferably, the edge of the cut hole should not coincide with the location of the shorting defect to avoid smearing of the shorted defect as in prior art physical removal methods. Therefore, it is best for the edges of the removed section (or the hole) to be at least 0.5 mm away from the defect, not to disturb the defect itself but to remove the device segment around it. It should be noted that the removed solar cell segment represents a generated current loss in the individual solar cell that is left with a hole in its body. However, considering the fact that the individual solar cells that are cut from a continuous completed solar cell structure 142 (shown in FIG. 14) usually have an area larger than 100 cm$^2$, even a large 1 cm$^2$ cut hole represents a current loss of only 1%. However, the fill factor is a much more important parameter than the short circuit current of the solar cell in use. Therefore, while a 100 cm$^2$ area exemplary CIGS device with a severe shunt defect (fill factor of 0.25) may provide an output current of 1.5 A at 0.25V, the same device with a 1-15 cm$^2$ segment around the shunt defect removed may provide about 2.3-2.7 A at 0.35-0.45V. This corresponds to an improvement of the cell efficiency from about 4% to about 9% by removing a 1-15 cm$^2$ area segment from it.

The removal of the solar cell segments from the completed solar cells may be carried out before or after the electrical measurement of the solar cell, using various different cutting tools such as punches, hole saws, stamping tools, hole cutters, etc., preferably punches. These instruments cut through the whole device structure including the substrate and remove the solar cell segment leaving behind clean walls at the edges of the hole. In one embodiment a stabilizer layer, such as an insulating layer, is first deposited over the defect containing area or segment that would be removed by mechanical means and then the segment is removed by cutting through the insulating layer before cutting through the solar cell structure. This way, a better cut is obtained because the insulator layer acts as a cap and does not allow much chipping, peeling and debris to be generated on the walls of the hole left behind. Therefore, presence of the stabilizer layer keeps the solar cell structure intact around the cut segment. A similar stabilizer layer, such as an insulator layer, may also be deposited on the back surface of the substrate at the defect region so that the segment of the solar cell to be removed is sandwiched between two layers of the insulating material, one on the top illuminated surface of the solar cell and the other on the back surface of the substrate. This insulator layer may be a UV curable ink, preferably a transparent ink that can be dispensed over the defect areas to be removed and then its remaining portion after the cut may be left there. Being transparent, such remaining portion of an insulating layer does not reduce the efficiency of the solar cell.

In a scribing process that is performed on a solar cell, debris generated comes up and stays on the solar cell surface and may cause additional shorting. In the cutting-through process the debris generated is pushed through the hole generated and the only concern is to keep the walls of the hole clean, which is relatively easy to do since the hole is a open structure that can be washed if needed. The solar cell segment removal processes described herein may be carried out in a dry environment or they may be carried out in a liquid environment, such as in water, to wash out the generated debris and dissipate the generated heat. A mild etchant such as discussed above and other chemicals such as surfactants may be present in the liquid to further clean the debris from the edge of the holes left behind by the removed segments. Unlike in the prior art approaches, the etchants used may be mild (for example, low concentration acidic solution with a pH value in the range of 1-7) so that they don't readily etch the solar cell structure, but they can chemically attack the small particles generated by the cutting process. This is a combined chemical/physical material removal process.

The present embodiments may be carried out in batch mode involving the defect detection and position determination, together with the solar cell segment removal processes being carried out in batch mode on individual finished solar cells. Alternately, the defect detection and the solar cell segment removal steps may be carried out in a roll-to-roll manner before the solar cells are individually cut from a flexible workpiece. Furthermore, it is also possible that the defect detection and location determination may be carried out in a roll-to-roll manner and then the segment removal process may be applied to the individual solar cells in batch mode after the individual solar cells are cut out of the roll of a continuous solar cell structure and separated from each other. The advantage of this last approach is the fact that the segment removal step and the tool used for that operation may be simple to build and operate.

Figure 14:
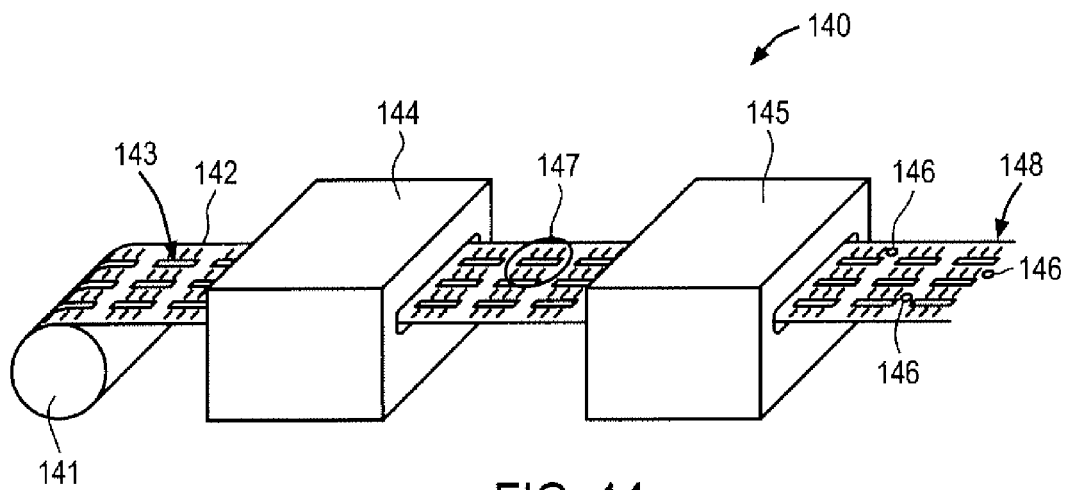
FIG. 14 shows an embodiment of a roll-to-roll system including a solar cell defect detection unit and a solar cell segment removal station.

For a complete roll-to-roll approach, an exemplary CIGS type solar cell structure may be prepared on a continuous metallic foil substrate. This structure may include the metallic foil substrate, a contact layer, the CIGS absorber layer, a buffer layer, a transparent conductive layer and grid patterns. FIG. 14 shows an example of such a manufacturing system 140 comprising a defect detection/location identification unit 144 and solar cell segment removal unit 145. A continuous completed solar cell structure 142 comprising all the layers of the solar cell including the grid patterns 143 is fed from a roll 141 into the defect detection/location identification unit and then through the solar cell segment removal unit 145. Defect detection and solar cell segment removal may both occur at the same station—for example, at station 144. This reduces the footprint of the tool and, because the web is not moved, this also simplifies the alignment between the detection and removal steps. It should be noted that each of the many grid patterns 143 on the continuous completed solar cell structure 142 represents an individual solar cell that will be later cut and separated from the continuous solar cell structure after the detected defects and their surrounding areas are removed from the structure by the solar cell segment removal unit 145. One such individual solar cell is shown in the circle 147 in FIG. 14.

A portion of the continuous completed solar cell structure 142 may be inspected for defects using one or more of the techniques previously described. The locations of these defects may be determined and stored in a computer. When the portion is moved into the solar cell segment removal unit 145, this location information may be used by the removal tool to remove the solar cell segment around each of the defects detected. As described before, the removed segments 146 may have areas as small as 0.001 cm$^2$ or less, and as large as several cm$^2$ depending on the size of the defect. The continuous completed solar cell structure with removed segments 148 may then be advanced to be rolled around a receiving spool (not shown) or it may be forwarded to other process units for further processing, such as cutting/slitting of the individual solar cells, their testing, sorting, binning, interconnection, lamination into a module, or the like.

Figure 15:
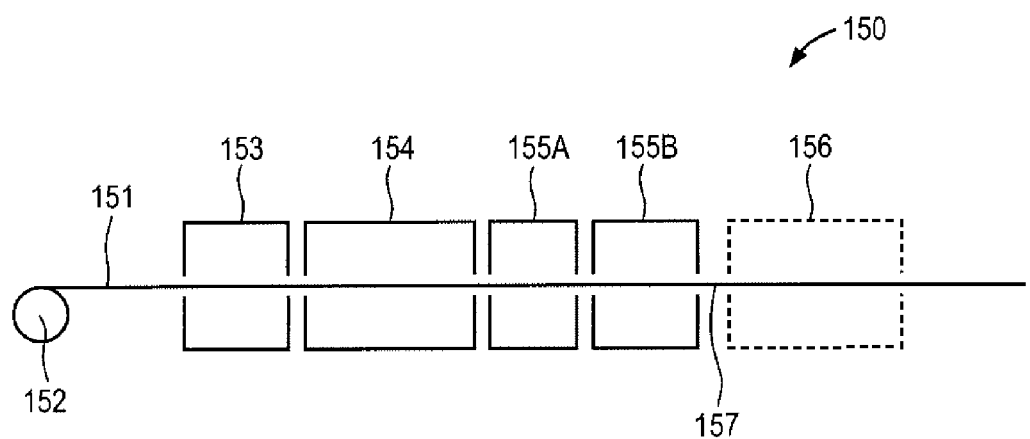
FIG. 15 shows a roll-to-roll integrated system with various solar cell manufacturing units including the solar cell defect detection and segment removal units shown in FIG. 14.

The process steps of the embodiments described herein are especially suited for integration into a process tool used for forming the grid patterns. FIG. 15 shows such an integrated tool 150 comprising one or more printing sectors 153, one or more curing sectors 154, one or more defect location detection sectors 155A, one or more solar cell segment removal sectors 155B, and one or more optional sectors 156. The integrated tool 150 applies these different processes to a continuous workpiece 151 that may be supplied by a supply roll or spool 152. The continuous workpiece 151 may be a solar cell structure such as the one shown in FIGS. 12A and 12B except that it does not have any grid pattern. A grid pattern is deposited by the one or more printing sectors 153, preferably by screen printing. The grid pattern is dried and cured in the one or more curing sectors 154. Defect location determination and solar segment removal processes are then carried out in the two sectors labeled as 155A and 155B as described in reference to FIG. 14. As the continuous completed solar cell structure with removed segments 157 comes out of the one or more solar cell segment removal sectors 155B it may be moved into one or more optional sectors 156. These optional sectors may include at least one of a test station that measures the resistance and continuity of the grid pattern, a hole-repair station that will be discussed later, a cutter/slitter, etc. If the continuous completed solar cell structure with removed segments 157 is not cut across its width in one of the optional sectors 156, then it may be rolled onto a receiving spool (not shown). If it is slit along its length it may be rolled onto more than one receiving spools. If it is cut across its width, then the cut cells maybe collected at the output of the integrated tool 150 for further processing or measurement.

Figure 16:
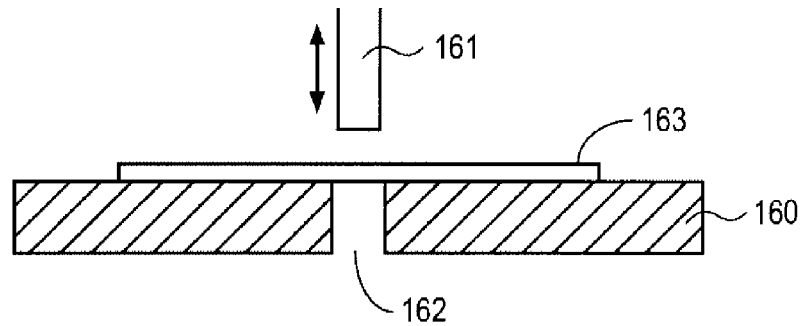
FIG. 16 shows a solar cell segment cutting apparatus.

In the embodiment of FIG. 15, inspection and shorting defect location determination on the solar cell structure with grid pattern is performed after the screen printing and curing of the grid pattern, which typically comprise conducting fingers and busbars. As an example, during the inspection period, the web may be held stationary beneath a medium-wavelength-infrared (MWIR) camera and the shunts in the device may be detected by the illuminated lock-in thermography method. Before the web is advanced, two widely separated fiducials, which are essentially reference positions, may be marked on the affected solar cell, preferably on at least one busbar of the affected cell, by a robotic ink dispenser disposed underneath the camera. Busbars are preferable for marking since they represent a shadowed area of the device that does not contribute to photocurrent generation. If a transparent fiducial mark is used, it may be placed anywhere on the top surface that will become the solar cell area after the cell is cut from the continuous web. The positions of the fiducials and the position of the shunts with respect to the fiducials for each affected cell may be saved in a "shorting defect position file" and the cell may be marked with a bar code that associates it with its shorting defect position file after the cell is cut from the web. Within the defect position file both the shunt positions and the fiducial positions are in the coordinate system of the robotic dispenser. To obtain the shunt positions from their location in the camera image, the chuck holding the web is marked with two or more fiducial spots next to the edges of the web that appear near at least two of the four corners of the camera's field of view (FOV). The positions of these four fiducials in the coordinate system of the dispenser are determined in advance, thereby enabling the shunt positions in the camera image to be converted to positions in the dispenser coordinate system. In one embodiment, the web is scribed along both edges (in edge exclusion areas that would later be cut off) before it is imaged by the camera to prevent current leakage along the sides of the web. This restricts more of the current to flow through the shunts during application of the illuminated lock-in thermography method, thereby enhancing the detection sensitivity. In one embodiment, the shorting defect position determination and marking of such positions is carried out in a roll-to-roll fashion and then the individual solar cells are cut from the continuous solar cell structure. After the cells have been cut from the web the cells may be brought in a stack to a pick and place robot (see FIG. 16), operating above a vacuum chuck 160 equipped with a hole punch 161 lined up with a hole 162 near its center as shown in FIG. 16. The robot may pick up a solar cell 163 from the stack and place it roughly centered upon the chuck 160 with the grid pattern preferably facing the hole punch 161 and the substrate preferably facing the chuck 160. Alternatively, it may be preferable to punch with the grid pattern facing the chuck and the substrate facing the hole punch. A CCD camera (not shown) above the chuck 160 may locate the two fiducials marked on the solar cell 163, preferably on the busbar; this allows calculation of the shunt positions in the coordinate system of the pick and place robot. The robot next may pick up the cell 163 and reposition it upon the chuck 160 so that the first shunt is aligned on top of the hole 162 position. The hole punch 161 then moves down passing through the solar cell 163 and the hole 162, removing a section of the solar cell 163 around the defect and including the defect, and produces a hole in the solar cell 163. The robot then may repeat the positioning and punching steps to remove additional sections of the solar cells that may have shorting defects. It should be noted that deposition of fiducial marks on each individual solar cell affected by a shorting defect allows these cells to be cut from a continuous web and separated from each other, before the segment removal process. Since each cell carries with itself the defect position information with respect to its fiducials, they do not need to stay aligned with respect to an outside reference throughout the defect detection and segment removal process steps. It should be noted that the segment removal process may be carried out on cells before or after the cells are measured for their efficiency values, although it is preferred that such measurement is performed both before and after the segment removal step so that solar cell efficiency improvement by the segment removal process is confirmed and recorded.

Figure 17:
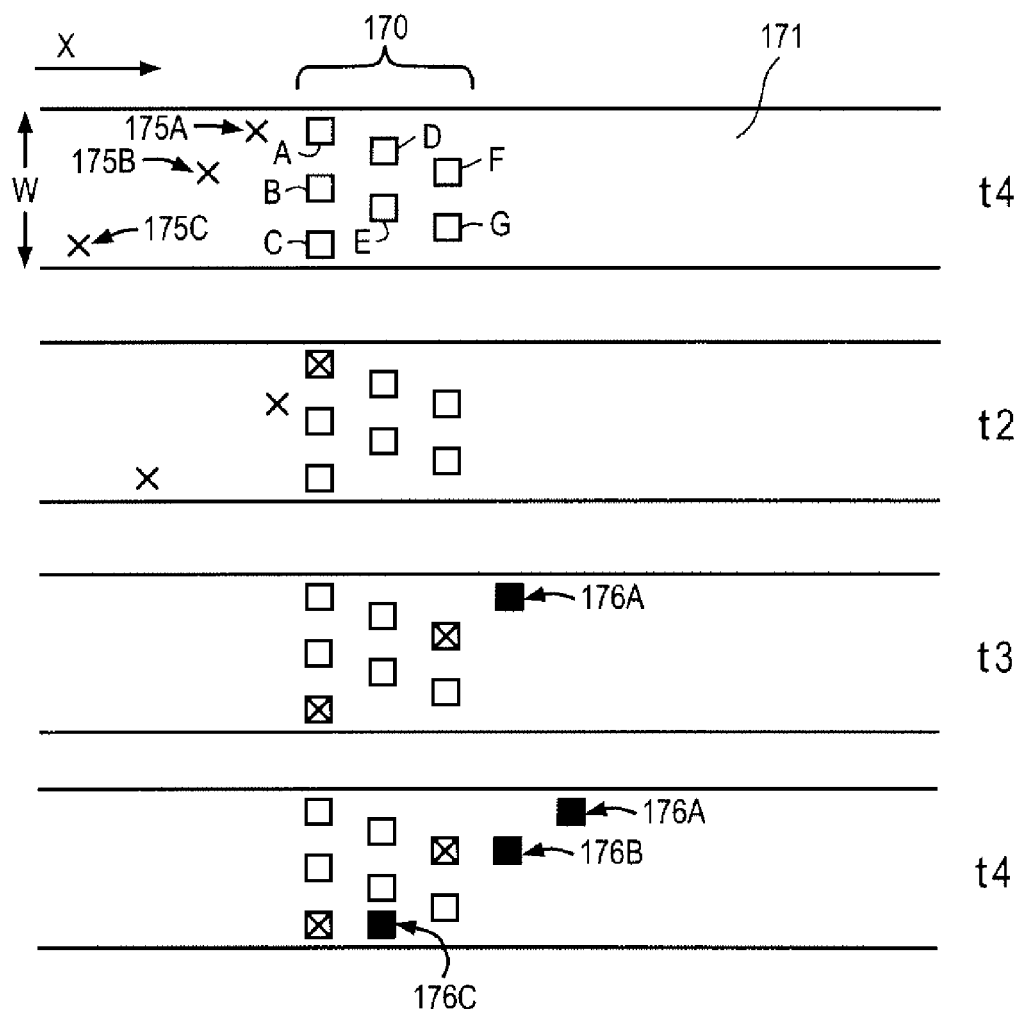
FIG. 17 shows exemplary stages of a segment removal process.

As stated before, the segment removal process may be carried out (see for example FIG. 15) before the individual solar cells are cut from a continuous web or solar cell structure with grid pattern. In this case it is possible to use one or more punches that can move across the width of the web and punch holes in the solar cell structure. One preferred embodiment of a method and apparatus that can be used in the solar cell segment removal sector 155B of FIG. 15 is shown in FIG. 17. The apparatus comprises an array of hole generating tools 170, such as punches, placed in a process area and arranged so that holes may be formed anywhere along a width 'W' of a web 171 that may be moved in a linear fashion through the process area. In FIG. 17 the web 171, which may be a continuous completed solar cell structure with grid patterns, is moved from left to right in 'x' direction. Although the sketch of FIG. 17 is a top view (illuminated surface view) of the web, the grid patterns are not shown for simplification of the figure. The small squares indicate the locations of the hole generating tools 170 comprising seven cutters A, B, C, D, E, F, and G. There are three exemplary shorting defect locations 175A, 175B and 175C on the web 171 that may be previously determined by the inspection/detection/location assignment step(s) of the process. FIG. 17 describes the process as the web 171 is moved from left to right through times t1, t2, t3 and t4. At time t1 the defect locations 175A, 175B and 175C are to the left of the hole generating tools 170. At time t2 the shorting defect location 175A comes under the cutter A. This position information may be provided to the cutters by the inspection/detection step of the process, or the coordinates of the defect positions may be determined within the segment removal tool of FIG. 17 using the previously placed fiducial marks as explained before. Cutter A cuts a segment of the web 171 around the shorting defect location 175A, forming a first hole 176A. The first hole 176A can be seen from the status at time t3, at which time the shorting defect locations 175B and 175C came under the cutters F and C, respectively. The cutters F and C cut two holes, 176B and 176C in the web 171 around the defect locations 175B and 175C, respectively, as can be seen from the status of the web 171 at time t4 when it is further moved to the right. It should be noted that by adding more cutting tools, the speed of this process may be increased and some of the cutters may be cleaned and serviced as other cutters continue to operate. The cutting tools may cut holes of various shapes such as circular, rectangular, triangular, or the like.

If the solar cells with removed segments are packaged in module structures with white background, the holes cut in the solar cells would appear as white spots within the dark colored solar cells. It may therefore be necessary to fill these holes with a color similar to the color of the solar cell, especially if light colored packaging materials would be used in the module package in the back of the solar cells. In one embodiment, a hole-fixing unit may be used after the holes are generated in the completed solar cell structures. In this operation, the shorting defect location information that is still available in the computer of the system may be used for a robot to place a small sheet of material on the back surface of the solar cell where the hole is. The small sheet may have an adhesive and it covers the hole from the back side of the solar cell. The color of the material may be selected to be similar to the color of the top surface of the solar cell so that when these solar cells are packaged into a module, the holes are not very visible. Alternately, after placing the small sheet of material on the back surface of the solar cell, the portion of the sheet exposed through the hole may be automatically painted by a painting probe from the top side of the solar cell, making the hole invisible. In one embodiment, the region to be punched is first photographed by a CCD camera and the photograph is stored as a true color image. After the hole is punched and the adhesive is placed on the back of the substrate to cover the hole, the true color image is printed over the same region including the adhesive and surrounding cell with an ink jet printer so that the hole becomes invisible to eye. It is even possible to first fill the hole from the top with an insulating material, such as an UV curable ink, before the cells are printed and packaged into a module structure. It is even possible to fill the hole from the top with an insulating material, such as an UV curable ink, before the cells are packaged into a module structure. Such hole filling may be used for cosmetic reasons (color etc.) as explained before, but it may also help stabilize the solar cell structure exposed at the edges of the holes. For example, an insulating filler material filling the hole, covers the exposed portion of the solar cell structure on the wall of the hole so that this portion of the solar cell structure does not get stressed and broken during the module packaging procedures. The small sheet of material used for the above processes is preferably an insulating material such as a polymeric sheet that would be stable during the lamination process of solar modules. Such lamination processes are typically carried out at temperatures of 100-150° C.

Although the present inventions are described with respect to certain preferred embodiments, modifications thereto will be apparent to those skilled in the art.

We claim:
1. A method of detecting and removing at least one defect from solar cells, comprising:
providing a solar cell including a back side and a front light receiving side disposed over the back side, wherein the back side includes a substrate, and the front light receiving side includes a photovoltaic layer disposed over the substrate and a terminal disposed over the photovoltaic layer;

detecting the at least one defect in at least one area of the solar cell; and mechanically cutting out at least one segment including the at least one defect and a surrounding portion of the photovoltaic layer and the substrate around the at least one defect to remove the at least one defect from the solar cell, wherein the step of mechanically cutting out the at least one segment leaves a cavity extending between and including the front light receiving side and back side of the solar cell including the substrate wherein the step of mechanically cutting is performed by a punch that is laterally and longitudinally movable across the surface of the solar cell for accurate positioning over the at least one defect, and wherein the punch mechanically cuts through the solar cell to remove the at least one segment including the at least one defect.

2. The method of claim 1 further comprising coating the solar cell with a stabilizing film before the step of mechanically cutting.

3. The method of claim 2 wherein the step of mechanically cutting is performed with the at least one segment submerged in a solution.

4. The method of claim 3, wherein the at least one segment includes a portion of the terminal.

5. The method of claim 1 wherein the step of mechanically cutting is performed with at least one segment submerged in a solution.

6. The method of claim 1, wherein the photovoltaic layer includes an absorber film, a transparent conductive film formed over the absorber film, and wherein the absorber film is formed over a contact layer disposed on the substrate.

7. The method of claim 6 wherein the absorber film includes a Group IBIIIAVIA thin film semiconductor and the substrate is a stainless steel foil.

8. The method of claim 1, wherein the step of detecting is performed using illuminated lock-in thermography using a near IR illumination source to improve a signal to noise ratio.

9. The method of claim 1 further comprising occluding the cavity with one of a patch or filler after the step of mechanically cutting.

10. The method of claim 1 further comprising determining a position of the at least one defect and registering the position using a memory device of a control system including a computer prior to the step of mechanically cutting.

11. The method of claim 10 wherein the step of detecting includes obtaining an image of a top surface of the at least one area of the solar cell by an optical camera.

12. The method of claim 11 further comprising occluding the cavity with at least one of a patch and filler after the step of mechanically cutting.

13. The method of claim 12 further comprising printing at least one color over the at least one of the patch and the filler to provide a more uniform surface appearance over the cavity.

14. The method of claim 11 wherein the step of detecting includes marking the top surface of the at least one segment with a marker ink that is detectable by the optical camera, and wherein the step of mechanically cutting includes detecting the marking ink with the optical camera.

15. The method of claim 1, wherein after the step of detecting, the solar cell is positioned by a positioning device over a punch station that includes the punch, wherein the positioning device comprises one of a robotic arm and x-y stage.

16. The method of claim 1 wherein the step of detecting detects a first defect in a first area of the solar cell as the at least one defect and a second defect in a second area of the solar cell, and the step of mechanically cutting out a first segment and a second segment by simultaneously punching through the solar cell using a first punch and a second punch with one punch action to remove the first defect and the second defect.

17. The method of claim 16, wherein the after the step of detecting, the solar cell is positioned by a positioning device over a punch station that includes the first punch and the second punch, wherein the positioning device comprises one of a robotic arm and x-y stage.

18. The method of claim 1, wherein the step of detecting includes obtaining an image of a top surface of the solar cell by an optical camera.

19. The method of claim 18 further comprising:

dispensing fiducial marks on the terminal of the front light receiving surface with a marker ink that is detectable by the optical camera using an ink dispenser that has an ink dispenser coordinate system;

wherein the step of detecting includes recording fiducial positions of the fiducial marks together with a position of the at least one defect using the ink dispenser coordinate system; and wherein the step of mechanically cutting includes aligning the punch using the recorded fiducial positions and the position of the at least one defect from the ink dispenser coordinate system in a coordinate system of the punch.

20. A method of solar cell manufacturing including a defect detection and removal process in a roll to roll system, comprising:

forming a continuous flexible solar cell structure including a plurality of solar cells, wherein each solar cell includes a back side and a front light receiving side disposed over the back side, wherein the back side includes a substrate, and the front light receiving side includes a photovoltaic layer disposed over the substrate and a terminal disposed over the photovoltaic layer;

dispensing fiducial marks on the terminal of the front light receiving surface with a marker ink that is detectable by the optical camera using an ink dispenser that has an ink dispenser coordinate system;

advancing a section of the continuous flexible solar cell structure in front of a detector, wherein the section of the continuous flexible solar cell structure includes a first solar cell of the plurality of solar cells;

detecting a defect in the first solar cell using the detector, wherein the step of detecting includes obtaining a color image of a top surface of the segment by an optical camera, and wherein the step of detecting includes recording fiducial positions of the fiducial marks together with a position of the defect using the ink dispenser coordinate system; and mechanically cutting out a segment that includes the defect and a surrounding portion of the photovoltaic layer and the substrate around the defect using a cutter tool to thereby remove the defect from the first solar cell, wherein the mechanically cutting out the segment of the solar cell leaves a cavity extending between and including the front light receiving side and back side of the first solar cell including the substrate, wherein the cutter tool is a punch that is laterally and longitudinally movable across the surface of the solar cell for accurate positioning over the defect, wherein the punch mechanically cuts through the solar cell to remove the segment including the defect, and wherein the step of mechanically cutting includes aligning the punch using the recorded fiducial positions and the position of the defect from the ink dispenser coordinate system in a coordinate system of the punch.

21. The method claim 20, wherein the detecting and mechanically cutting out steps are performed in a detection and removal station such that after detecting the defect by the detector, the cutter tool cuts out the segment without movement of the first solar cell within the detection and removal station.

22. The method claim 20, wherein the detecting step is performed in a detection station where the detector is located.

23. The method of claim 22, further comprising the step of advancing the section of the continuous flexible solar cell structure including the first solar cell into a defect removal station, where the cutter tool that cuts out the segment is located.

24. The method of claim 20 further comprising coating the first solar cell with a stabilizing film before the step of mechanically cutting.

25. The method of claim 24 wherein the step of mechanically cutting is performed with the segment submerged in a solution.

26. The method of claim 24 wherein the step of mechanically cutting is performed using a cutting edge coated with a solution.

27. The method of claim 20, wherein the step of detecting is performed by illuminated lock-in thermography using a near IR illumination source to improve a signal to noise ratio.

28. The method of claim 20 further comprising occluding the cavity with one of a patch or filler after the step of mechanically cutting.

29. The method of claim 20 wherein the step of detecting includes determining a position of the defect and registering the position using a memory device of a control system including a computer prior to the step of mechanically cutting.

30. The method of claim 20 further comprising occluding the cavity with one of a patch and filler after the step of mechanically cutting.

31. The method of claim 30 further comprising printing at least one color over the at least one of the patch and the filler to provide a more uniform surface appearance over the cavity.

32. The method of claim 20, wherein the photovoltaic layer includes an absorber film, a transparent conductive film formed over the absorber film, and wherein the absorber film is formed over a contact layer disposed on the substrate.

33. The method of claim 32, wherein the absorber film includes a Group IBIIIAVIA thin film semiconductor and the substrate is a stainless steel foil.

* * * * *